(12) United States Patent
Venkatesh et al.

(10) Patent No.: US 11,782,077 B2
(45) Date of Patent: Oct. 10, 2023

(54) SYSTEM AND METHOD FOR PERFORMING A LINE-WISE POWER FLOW ANALYSIS FOR A POWER SYSTEM

(71) Applicants: Balasubramanian Venkatesh, Markham (CA); Amr Adel Fathy Mohamed, Toronto (CA)

(72) Inventors: Balasubramanian Venkatesh, Markham (CA); Amr Adel Fathy Mohamed, Toronto (CA)

(73) Assignees: Balasubramanian Venkatesh, Markham (CA); Amr Adel Fathy Mohamed, Toronto (CA)

( * ) Notice: Subject to any disclaimer, the term of this patent is extended or adjusted under 35 U.S.C. 154(b) by 1207 days.

(21) Appl. No.: 16/233,745

(22) Filed: Dec. 27, 2018

(65) Prior Publication Data

US 2020/0209291 A1 Jul. 2, 2020

(51) Int. Cl.
| | |
|---|---|
| G01R 21/00 | (2006.01) |
| G01R 21/133 | (2006.01) |
| G06F 7/483 | (2006.01) |
| G06F 7/544 | (2006.01) |
| H02J 3/06 | (2006.01) |

(52) U.S. Cl.
CPC ......... *G01R 21/003* (2013.01); *G01R 21/005* (2013.01); *G01R 21/1331* (2013.01); *G06F 7/483* (2013.01); *G06F 7/544* (2013.01); *H02J 3/06* (2013.01); *G06F 2207/5355* (2013.01)

(58) Field of Classification Search
USPC .......................................................... 702/61
See application file for complete search history.

(56) References Cited

U.S. PATENT DOCUMENTS

2020/0021133 A1* 1/2020 Liu ........................... H02J 3/12

OTHER PUBLICATIONS

Monticelli, "Electric power system state estimation", Feb. 2000, pp. 262-282 (Year: 2000).*
Cain et al., "History of Optimal Power Flow and Formulations: Optimal Power Flow Paper 1", Federal Energy Regulatory Commission, 2012, pp. 1-36.
Mohamed et al., "Line-Wise Power Flow and Voltage Collapse", IEEE Transactions on Power Systems, Jul. 4, 2018, 33(4): 3768-3778.
Mohamed et al., "Line-Wise Optimal Power Flow Using Successive Linear Optimization Technique", IEEE Transactions on Power Systems, Nov. 14, 2018 / May 2019, 34(3): 2083-2092.
Monticelli, "Electric power system state estimation", Proceedings of the IEEE, Feb. 2000, 88(2): 262-282.

* cited by examiner

*Primary Examiner* — Toan T Vu
*Assistant Examiner* — Xuan Ly
(74) *Attorney, Agent, or Firm* — BERESKIN & PARR LLP/S.E.N.C.R.L. s.r.l; Tonino Rosario Orsi

(57) ABSTRACT

Various embodiments are provided for conducting a power flow analysis using a set of line-wise power balance equations. In at least some embodiment, the set of line-wise power balance equations is solved using a Newton-Raphson technique. In various cases, the Jacobian matrix generated by the Newton-Raphson technique may directly indicate the transmission lines, or sets of transmission lines, which are most susceptible to voltage collapse. In at least one example application, the set of line-wise power balance equations may be used as equality constraints in an optimal power flow (OPF) formulation for solving an optimal power flow (OPF) problem.

24 Claims, 18 Drawing Sheets

300A

| $\left[\dfrac{\partial FF}{\partial U}\right]$ $NT \times NLB$ | $\left[\dfrac{\partial FF}{\partial \delta}\right]$ $NT \times (NB-1)$ | $\left[\dfrac{\partial FF}{\partial PF}\right]$ $NT \times NT$ | $\left[\dfrac{\partial FF}{\partial PS}\right]$ $NT \times NT$ | $\left[\dfrac{\partial FF}{\partial QF}\right]$ $NT \times NT$ | $\left[\dfrac{\partial FF}{\partial QS}\right]$ $NT \times NT$ |
|---|---|---|---|---|---|
| $\left[\dfrac{\partial FS}{\partial U}\right]$ $NT \times NLB$ | $\left[\dfrac{\partial FS}{\partial \delta}\right]$ $NT \times (NB-1)$ | $\left[\dfrac{\partial FS}{\partial PF}\right]$ $NT \times NT$ | $\left[\dfrac{\partial FS}{\partial PS}\right]$ $NT \times NT$ | $\left[\dfrac{\partial FS}{\partial QF}\right]$ $NT \times NT$ | $\left[\dfrac{\partial FS}{\partial QS}\right]$ $NT \times NT$ |
| $\left[\dfrac{\partial FA}{\partial U}\right]$ $NT \times NLB$ | $\left[\dfrac{\partial FA}{\partial \delta}\right]$ $NT \times (NB-1)$ | $\left[\dfrac{\partial FA}{\partial PF}\right]$ $NT \times NT$ | $\left[\dfrac{\partial FA}{\partial PS}\right]$ $NT \times NT$ | $\left[\dfrac{\partial FA}{\partial QF}\right]$ $NT \times NT$ | $\left[\dfrac{\partial FA}{\partial QS}\right]$ $NT \times NT$ |
| $\left[\dfrac{\partial FB}{\partial U}\right]$ $NT \times NLB$ | $\left[\dfrac{\partial FB}{\partial \delta}\right]$ $NT \times (NB-1)$ | $\left[\dfrac{\partial FB}{\partial PF}\right]$ $NT \times NT$ | $\left[\dfrac{\partial FB}{\partial PS}\right]$ $NT \times NT$ | $\left[\dfrac{\partial FB}{\partial QF}\right]$ $NT \times NT$ | $\left[\dfrac{\partial FB}{\partial QS}\right]$ $NT \times NT$ |
| $\left[\dfrac{\partial FP}{\partial U}\right]$ $(NB-1) \times NLB$ | $\left[\dfrac{\partial FP}{\partial \delta}\right]$ $(NB-1) \times (NB-1)$ | $\left[\dfrac{\partial FP}{\partial PF}\right]$ $(NB-1) \times NT$ | $\left[\dfrac{\partial FP}{\partial PS}\right]$ $(NB-1) \times NT$ | $\left[\dfrac{\partial FP}{\partial QF}\right]$ $(NB-1) \times NT$ | $\left[\dfrac{\partial FP}{\partial QS}\right]$ $(NB-1) \times NT$ |
| $\left[\dfrac{\partial FQ}{\partial U}\right]$ $NLB \times NLB$ | $\left[\dfrac{\partial FQ}{\partial \delta}\right]$ $NLB \times (NB-1)$ | $\left[\dfrac{\partial FQ}{\partial PF}\right]$ $NLB \times NT$ | $\left[\dfrac{\partial FQ}{\partial PS}\right]$ $NLB \times NT$ | $\left[\dfrac{\partial FQ}{\partial QF}\right]$ $NLB \times NT$ | $\left[\dfrac{\partial FQ}{\partial QS}\right]$ $NLB \times NT$ |

FIG. 3A

| | Method | Number Of Equations | Number of Terms | | | | Number of Products | |
|---|---|---|---|---|---|---|---|---|
| | | | 4th Order | 3rd Order | 2nd Order | 1st Order | With Sine or Cosine Terms | Without Sine or Cosine Terms |
| 6-Bus | Line-wise | 37 | 0 | 0 | 168 | 40 | 56 | 320 |
| | Bus-wise | 9 | 44 | 9 | 0 | 0 | 203 | 0 |
| 14-bus | Line-wise | 102 | 0 | 0 | 480 | 108 | 160 | 908 |
| | Bus-wise | 22 | 130 | 22 | 0 | 0 | 586 | 0 |
| 57-bus | Line-wise | 426 | 0 | 0 | 1,920 | 434 | 640 | 3,634 |
| | Bus-wise | 106 | 562 | 106 | 0 | 0 | 2,566 | 0 |
| 118-bus | Line-wise | 925 | 0 | 0 | 4,464 | 980 | 1,488 | 8,420 |
| | Bus-wise | 181 | 1,034 | 181 | 0 | 0 | 4,679 | 0 |
| 582-bus | Line-wise | 4,878 | 0 | 0 | 23,160 | 5,024 | 7,720 | 43,624 |
| | Bus-wise | 1,018 | 5,140 | 1,018 | 0 | 0 | 23,614 | 0 |
| 2383-bus | Line-wise | 16,022 | 0 | 0 | 69,504 | 16,350 | 23,168 | 132,190 |
| | Bus-wise | 4,438 | 22,408 | 4,438 | 0 | 0 | 102,946 | 0 |
| 9241-bus | Line-wise | 81,232 | 0 | 0 | 385,176 | 82,678 | 128,392 | 724,638 |
| | Bus-wise | 17,036 | 86,017 | 17,036 | 0 | 0 | 395,175 | 0 |

FIG. 4C

| | Method | Number of Jacobian Elements | Number of Fourth Order Terms | Number of Cubic Terms | Number of Quadratic Terms | Number of Linear Terms | Number of Products |
|---|---|---|---|---|---|---|---|
| 6-Bus | Line-wise | 136 | 0 | 0 | 56 | 336 | 448 |
| | Bus-wise | 49 | 145 | 17 | 0 | 0 | 631 |
| 14-bus | Line-wise | 381 | 0 | 0 | 160 | 960 | 1,280 |
| | Bus-wise | 146 | 464 | 40 | 0 | 0 | 1,976 |
| 57-bus | Line-wise | 1,678 | 0 | 0 | 640 | 3840 | 5,120 |
| | Bus-wise | 718 | 2,254 | 206 | 0 | 0 | 9,634 |
| 118-bus | Line-wise | 3,310 | 0 | 0 | 1488 | 8928 | 11,904 |
| | Bus-wise | 1,049 | 3,269 | 309 | 0 | 0 | 14,003 |
| 582-bus | Line-wise | 20,916 | 0 | 0 | 7720 | 46320 | 61,760 |
| | Bus-wise | 6,740 | 21,284 | 1,892 | 0 | 0 | 90,812 |
| 2383-bus | Line-wise | 56,393 | 0 | 0 | 23,168 | 139,008 | 185,344 |
| | Bus-wise | 27,783 | 87,147 | 7,747 | 0 | 0 | 371,830 |
| 9241-bus | Line-wise | 332,302 | 0 | 0 | 128,392 | 770,352 | 1,027,136 |
| | Bus-wise | 128,689 | 337,947 | 30,041 | 0 | 0 | 1,441,914 |

| Number of Busses | Traditional bus-wise Jacobian matrix | | | Proposed line-wise Jacobian matrix | | |
|---|---|---|---|---|---|---|
| | Size | Condition Number | Sparsity Factor | Size | Condition Number | Sparsity Factor |
| 6 | 9X9 | 5.3E+1 | 39.5 | 37X37 | 3.4E+2 | 90.1 |
| 14 | 22X22 | 2.4E+2 | 69.8 | 102X102 | 1.9E+3 | 96.3 |
| 57 | 106X106 | 2.9E+3 | 93.6 | 422X422 | 1.8E+4 | 99.1 |
| 118 | 181X181 | 5.7E+3 | 96.8 | 925X925 | 9.0E+4 | 99.6 |
| 582 | 1018X1018 | 6.5E+6 | 99.3 | 4878X4878 | 7.1E+7 | 99.9 |
| 2383 | 4438X4438 | 1.1E+6 | 99.86 | 16022X16022 | 1.8E+7 | 99.98 |
| 9241 | 17036X17036 | 1.6E+7 | 99.96 | 81232X81232 | 6.8E+8 | 99.99 |

| Contingency case/outage branches (rank) | Worst VCI | Most critical line (connects buses most susceptible to VC) | Execution time (seconds) | |
|---|---|---|---|---|
| | | | Bus-wise NR method | Line-wise NR method |
| 169 (1) | 0.1341 | L152-66 | 1.60 | 1.02 |
| 2058 (2) | 0.2081 | L1987-1981 | 1.57 | 0.90 |
| 469 (3) | 0.2113 | L437-188 | 1.57 | 1.02 |
| 2761 (4) | 0.2837 | L2209-2351 | 1.54 | 1.00 |
| 2144 (5) | 0.2906 | L2096-1912 | 1.54 | 1.01 |
| 405 (6) | 0.2927 | L434-188 | 1.57 | 1.03 |
| 467 (7) | 0.2981 | L431-229 | 1.47 | 1.04 |
| 404 (8) | 0.3261 | L431-229 | 1.57 | 1.04 |
| 2030 (9) | 0.3323 | L1822-1758 | 1.57 | 1.01 |
| 777 (10) | 0.3328 | L1999-1744 | 1.55 | 0.99 |
| 966 (11) | 0.3350 | L630-601 | 1.57 | 1.02 |
| 5 (12) | 0.3395 | L431-229 | 1.57 | 1.02 |
| 2767 (13) | 0.3460 | L2310-2289 | 1.54 | 1.01 |
| 2881 (14) | 0.3487 | L2137-2348 | 1.57 | 1.03 |
| 501 (15) | 0.3503 | L466-230 | 1.57 | 1.03 |
| 296 (16) | 0.3552 | L1906-145 | 1.57 | 1.01 |
| 513 (17) | 0.3554 | L352-253 | 1.57 | 1.07 |
| 292 (18) | 0.3583 | L129-148 | 1.60 | 1.03 |
| 2396 (19) | 0.3587 | L1992-1663 | 1.57 | 0.99 |
| 2401 (20) | 0.3658 | L1945-1850 | 1.57 | 1.00 |

FIG. 5D

| Method | A Matrix | | Number of Constraints in the Problem | | Number of higher order terms in A matrix and C vectors | | | Number of Largest terms in A matrix and C vectors (1st order) | Number of products in A matrix and C vectors | |
|---|---|---|---|---|---|---|---|---|---|---|
| | Size | Number of nonzero terms | Condition number | Equality | Inequality | 4th | 3rd | 2nd | | With Sine or Cosine Terms | Without Sine or Cosine Terms |
| 6 bus LW | 40 X 44 | 140 | 1.5·10⁵ | 40 | 10 | 0 | 0 | 56 | 240 | 56 | 396 |
| BW | 12 X 16 | 53 | 5.0·10¹ | 12 | 10 | 145 | 17 | 0 | 0 | 61 | 0 |
| 14 bus LW | 108 X 118 | 391 | 2.0·10⁵ | 108 | 24 | 0 | 0 | 160 | 970 | 160 | 1,130 |
| BW | 28 X 38 | 156 | 2.5·10² | 28 | 24 | 464 | 40 | 0 | 0 | 1,976 | 0 |
| 30 bus LW | 224 X 236 | 917 | 6.7·10⁵ | 224 | 42 | 0 | 0 | 328 | 1,980 | 328 | 2,308 |
| BW | 60 X 72 | 373 | 8.7·10² | 60 | 42 | 958 | 101 | 0 | 0 | 4,135 | 0 |
| 57 bus LW | 434 X 448 | 1,692 | 1.8·10⁶ | 434 | 71 | 0 | 0 | 640 | 3,854 | 640 | 4,494 |
| BW | 114 X 128 | 732 | 2.9·10² | 114 | 71 | 2,254 | 206 | 0 | 0 | 9,634 | 0 |
| 118 bus LW | 980 X 1088 | 3,418 | 9.0·10⁵ | 980 | 228 | 0 | 0 | 1,488 | 9,036 | 1,488 | 10,524 |
| BW | 236 X 344 | 1,157 | 5.5·10² | 236 | 228 | 3,209 | 309 | 0 | 0 | 14,003 | 0 |
| 200 bus LW | 2244 X 2382 | 9,463 | 1.5·10⁶ | 2,244 | 438 | 0 | 0 | 3,288 | 19,886 | 3,288 | 23,174 |
| BW | 600 X 738 | 3,874 | 7.3·10² | 600 | 438 | 7,867 | 992 | 0 | 0 | 34,444 | 0 |
| 500 bus LW | 5024 X 5314 | 21,268 | 2.1·10⁶ | 5,024 | 872 | 0 | 0 | 7,720 | 46,610 | 7,720 | 54,330 |
| BW | 1164 X 1454 | 7,060 | 6.5·10² | 1,164 | 872 | 31,284 | 1,892 | 0 | 0 | 98,812 | 0 |
| 2383 bus LW | 16350 X 17004 | 57,047 | 1.8·10⁶ | 16,350 | 3,037 | 0 | 0 | 23,168 | 139,662 | 23,168 | 162,830 |
| BW | 4766 X 5420 | 28,437 | 1.1·10³ | 4,766 | 3,037 | 87,147 | 7,747 | 0 | 0 | 371,828 | 0 |
| 9241 bus LW | 85078 X 85598 | 335,192 | 6.8·10⁵ | 85,078 | 12,131 | 0 | 0 | 128,392 | 773,242 | 371,828 | 801,634 |
| BW | 18482 X 21372 | 133,579 | 1.9·10³ | 18,482 | 12,131 | 357,947 | 30,041 | 0 | 0 | 1,441,911 | 0 |

SYSTEM AND METHOD FOR PERFORMING A LINE-WISE POWER FLOW ANALYSIS FOR A POWER SYSTEM

FIELD

The teachings herein relate generally to power systems, and more particularly to various embodiments for a system and method for performing a line-wise power flow analysis for a power system.

BACKGROUND

Power flow analysis is an important tool in many aspects of power system engineering, and constitutes the basis for studies in power system optimization, power systems planning, and voltage stability analysis. In recent years, an increasing, wide-spread effort has been devoted to developing an efficient and accurate method for conducting power flow analysis.

Generally, power flow analysis is conducted by solving a set of equations to determine the state of a power system. The power system is described by voltage phasors at each power system bus, wherein each voltage phasor comprises magnitude and phase angle components. Further, the sum of all real and reactive powers coming into each bus of the power system is equal to zero.

A power flow analysis, upon completion, yields voltage phasor values for each bus, that can be used to determine power flow in all lines, system real power loss, reactive power output of all generators, and real power output of a slack generator.

SUMMARY OF VARIOUS EMBODIMENTS

In accordance with a broad aspect of the teachings herein, there is provided at least one embodiment of a method for conducting a power flow analysis for a power system, the power system comprising at least one transmission branch having a first end coupled to a first bus and a second end coupled to a second bus, the method being implemented by at least one server comprising at least one processor, the method comprising: initializing values for a problem vector (W); modelling the power system using a set of line-wise power balance equations that are functions of the problem vector (FT(W)); solving the set of line-wise power balance equations (FT(W)) using a numerical technique to obtain a line-wise solution vector; based on the line-wise solution vector, determining whether the power system is in a state of voltage stability; and implementing a remedial action to stabilize the power system when the power system is not in a state of voltage stability.

In at least one of these embodiments, the problem vector (W) is defined as W=[U δ PF PS QF QS], where: U is a vector of squared voltage magnitudes for each bus of each of the at least one transmission branch; δ is a vector of voltage angles for each bus of each of the at least one transmission branch; PF is a vector of active power flow in each first end of each of the at least one transmission branch; PS is a vector of active power flow in each second end of each of the at least one transmission branch; QF is a vector of reactive power flow in each first end of each of the at least one transmission branch, and QS is a vector of reactive power flowing in each second end of each of the at least one transmission branch.

In at least one of these embodiments, the set of line-wise power balance equations (FT(W)) is defined as:

$$FT(W) = \begin{bmatrix} FF(W) \\ FS(W) \\ FA(W) \\ FB(W) \\ FP(W) \\ FQ(W) \end{bmatrix}$$

where: FF(W) is a vector of line based voltage functions in relation to each first end of each of the at least one transmission branch; FS(W) is a vector of line-based voltage function in relation to each second end of each of the at least one transmission branch; FA(W) is a vector of phase angle functions in relation to each first end of each of the at least one transmission branch; FB(W) is a vector of phase angle functions in relation to each second end of each of the at least one transmission branch; FP(W) is a vector of functions for bus-wise real power injections; and FQ(W) is a vector of functions for bus-wise reactive power injections.

In at least one of these embodiments, the numerical technique for solving the set of line-wise power balance equations is a Newton-Raphson technique.

In at least one of these embodiments, solving the set of line-wise power balance equations using the Newton-Raphson technique comprises: determining an incremental change to the problem vector (ΔW) by solving a first-order Taylor's series approximation of the set of line-wise power balance equations (FT(W)):

$$\Delta W = \left[ \frac{\partial FT(W)}{\partial W} \right]^{-1} \cdot [ST - FT(W)]$$

where: ΔW is the incremental change to the problem vector;

$$\left[ \frac{\partial FT(W)}{\partial W} \right]^{-1}$$

is an inverse of a Jacobian matrix for the set of line-wise power balance equations; and ST is the desired line-wise solution vector for the set of line-wise power balance equations.

In at least one of these embodiments, the desired line-wise solution vector (ST) is defined according to ST=[0 0 0 0 [PD−PG] [QD−QG]]$^T$, where: PD is a vector of active power demand in each of the at least one transmission branches; PG is a vector of active power generation in each of the at least one transmission branches; QD is a vector of reactive power demand in each of the at least one transmission branches, and QG is a vector of reactive power generation in each of the at least one transmission branches.

In at least one of these embodiments, the method comprises: generating an updated problem vector (W') according to the equation: W'=W+ΔW; solving the set of line-wise power balance equations to generate an intermediate solution vector using the updated problem vector (W'); and based on the intermediate solution vector, determining whether a tolerance condition is satisfied, wherein when the tolerance condition is not satisfied, the method comprises iteratively solving for the updated problem vector using the first-order Taylor's series approximation until the intermediate solution vector satisfies the tolerance condition, and when the tolerance condition is satisfied, the intermediate solution vector comprises the line-wise solution vector.

In at least one of these embodiments, the tolerance condition is expressed as |ST−FT(W)|≥T, where T is a pre-defined tolerance threshold.

In at least one of these embodiments, the pre-defined tolerance threshold (T) is substantially zero.

In at least one of these embodiments, the line-wise solution vector yields voltage values at each bus of each of the at least one transmission branch of the power system, and line-wise real and reactive power flows in each of the at least one transmission branch of the power system.

In at least one of these embodiments, the set of line-wise based equations is formulated in terms of the square magnitude of the voltages at each bus in each of the at least one transmission branch in the power system.

In at least one of these embodiments, the functions for bus-wise real power injection, and the functions for bus-wise reactive power injection, are expressed in linear terms and the set of line-wise power balance equations include only first order and second order terms.

In at least one of these embodiments, initializing values for a problem vector (W), further comprises: reading a set of known data values from at least one sensor operatively coupled to the power system.

In at least one of these embodiments, the transmission branch comprises at least one of a transmission cable, a transmission line, and a transformer and each of the first bus and the second bus comprise at least one of a load bus and a generator bus.

In at least one of these embodiments, the Jacobian matrix includes, for each of the at least one transmission branches, a first vector element $$\left(\frac{\partial FF(W)}{\partial U}\right)$$

and a second vector element $$\left(\frac{\partial FS(W)}{\partial U}\right),$$

where the first vector element defines a first voltage collapse index (VCI) for a first end of the at least one transmission branch, and the second vector element defines a second VCI for a second end of the at least one transmission branch.

In at least one of these embodiments, determining whether the power system is in a state of voltage stability comprises determining whether at least one of the first VCI and the second VCI for a respective transmission branch is substantially zero, and the remedial action to stabilize the power system comprises at least one of: shedding a load bus in the power system, increasing a power output at least one generator bus in the power system, re-activating at least one standby generator bus in the power system, and re-inserting standby transmission elements in the power system.

In at least one of these embodiments, determining whether the power system is in a state of voltage stability further comprises: performing an N−1 contingency analysis for the power system.

In accordance with another broad aspect of the teachings herein, there is provided at least one embodiment of a system for conducting a power flow analysis for a power system, wherein the power system comprises at least one transmission branch having a first end coupled to a first bus and a second end coupled to a second bus, the system comprising: at least one server comprising at least one processor, wherein the at least one server is configured for: initializing values for a problem vector (W); modelling the power system using a set of line-wise power balance equations that are functions of the problem vector (FT(W)); solving the set of line-wise power balance equations (FT(W)) using a numerical technique to obtain a line-wise solution vector; based on the line-wise solution vector, determining whether the power system is in a state of voltage stability; and implementing a remedial action to stabilize the power system when the power system is not in a state of voltage stability.

In at least one of these embodiments, the problem vector (W) is defined as W=[U δ PF PS QF QS], where: U is a vector of squared voltage magnitudes for each bus of each of the at least one transmission branch; δ is a vector of voltage angles for each bus of each of the at least one transmission branch; PF is a vector of active power flow in each first end of each of the at least one transmission branch; PS is a vector of active power flow in each second end of each of the at least one transmission branch; QF is a vector of reactive power flow in each first end of each of the at least one transmission branch, and QS is a vector of reactive power flowing in each second end of each of the at least one transmission branch.

In at least one of these embodiments, the set of line-wise power balance equations (FT(W)) is defined as:

$$FT(W) = \begin{bmatrix} FF(W) \\ FS(W) \\ FA(W) \\ FB(W) \\ FP(W) \\ FQ(W) \end{bmatrix}$$

where: FF(W) is a vector of line based voltage functions in relation to each first end of each of the at least one transmission branch; FS(W) is a vector of line-based voltage function in relation to each second end of each of the at least one transmission branch; FA(W) is a vector of phase angle functions in relation to each first end of each of the at least one transmission branch; FB(W) is a vector of phase angle functions in relation to each second end of each of the at least one transmission branch; FP(W) is a vector of functions for bus-wise real power injections; and FQ(W) is a vector of functions for bus-wise reactive power injections.

In at least one of these embodiments, the numerical technique for solving the set of line-wise power balance equations is a Newton-Raphson technique.

In at least one of these embodiments, solving the set of line-wise power balance equations using the Newton-Raphson technique comprises: determining an incremental change to the problem vector (ΔW) by solving a first-order Taylor's series approximation of the set of line-wise power balance equations (FT(W)):

$$W = \left[\frac{\partial FT(W)}{\partial W}\right]^{-1} \cdot [ST - FT(W)]$$

where: ΔW is the incremental change to the problem vector;

$$\left[\frac{\partial FT(W)}{\partial W}\right]^{-1}$$

is an inverse of a Jacobian matrix for the set of line-wise power balance equations; and ST is the desired line-wise solution vector for the set of line-wise power balance equations.

In at least one of these embodiments, the desired line-wise solution vector (ST) is defined according to ST=[0 0 0 0 [PD–PG] [QD–QG]]$^T$, where: PD is a vector of active power demand in each of the at least one transmission branches; PG is a vector of active power generation in each of the at least one transmission branches; QD is a vector of reactive power demand in each of the at least one transmission branches, and QG is a vector of reactive power generation in each of the at least one transmission branches.

In at least one of these embodiments, the system comprises: generating an updated problem vector (W') according to the equation: W'=W+ΔW; solving the set of line-wise power balance equations to generate an intermediate solution vector using the updated problem vector (W'); and based on the intermediate solution vector, determining whether a tolerance condition is satisfied, wherein when the tolerance condition is not satisfied, the method comprises iteratively solving for the updated problem vector using the first-order Taylor's series approximation until the intermediate solution vector satisfies the tolerance condition, and when the tolerance condition is satisfied, the intermediate solution vector comprises the line-wise solution vector.

In at least one of these embodiments, the tolerance condition is expressed as |ST–FT(W)|≥T, where T is a pre-defined tolerance threshold.

In at least one of these embodiments, the pre-defined tolerance threshold (T) is substantially zero.

In at least one of these embodiments, the line-wise solution vector yields voltage values at each bus of each of the at least one transmission branch of the power system, and line-wise real and reactive power flows in each of the at least one transmission branch of the power system.

In at least one of these embodiments, the set of line-wise based equations is formulated in terms of the square magnitude of the voltages at each bus in each of the at least one transmission branch in the power system.

In at least one of these embodiments, the functions for bus-wise real power injection, and the functions for bus-wise reactive power injection, are expressed in linear terms and the set of line-wise power balance equations include only first order and second order terms.

In at least one of these embodiments, initializing values for a problem vector (W), further comprises: reading a set of known data values from at least one sensor operatively coupled to the power system.

In at least one of these embodiments, the transmission branch comprises at least one of a transmission cable, a transmission line, and a transformer and each of the first bus and the second bus comprise at least one of a load bus and a generator bus.

In at least one of these embodiments, the Jacobian matrix includes, for each of the at least one transmission branches, a first vector element $$\left(\frac{\partial FF(W)}{\partial U}\right)$$

and a second vector element $$\left(\frac{\partial FS(W)}{\partial U}\right),$$

where the first vector element defines a first voltage collapse index (VCI) for a first end of the at least one transmission branch, and the second vector element defines a second VCI for a second end of the at least one transmission branch.

In at least one of these embodiments, determining whether the power system is in a state of voltage stability comprises determining whether at least one of the first VCI and the second VCI for a respective transmission branch is substantially zero, and the remedial action to stabilize the power system comprises at least one of: shedding a load bus in the power system, increasing a power output at least one generator bus in the power system, re-activating at least one standby generator bus in the power system, and re-inserting standby transmission elements in the power system.

In at least one of these embodiments, determining whether the power system is in a state of voltage stability further comprises: performing an N−1 contingency analysis for the power system.

In accordance with another broad aspect of the teachings herein, there is provided at least one embodiment of a method for minimizing an objective function in respect of a power system, the power system comprising at least one transmission branch having a first end coupled to a first bus and a second end coupled to a second bus, the method being implemented using at least one server comprising at least one processor, the method comprising: (a) determining initial values for a control vector (WC); (b) using the control vector (WC), solving a set of line-wise power balance equations (FT(W')) to obtain a problem vector (W'), wherein the problem vector (W') comprises the control vector (WC) and a dependent vector (WD); (c) using the problem vector (W'), solving a line-wise linear optimization formulation to determine an optimal incremental change to the control vector (ΔWC); (d) updating the control vector (WC) based on the optimal incremental change in the control vector (ΔWC); and € determining whether the objective function is minimized by determining whether a set of stopping criteria is satisfied based on the updating of the control vector (WC), wherein when the set of stopping criteria is not satisfied, the method comprises iteratively repeating (b) to (d) until the set of stopping criteria is satisfied.

In at least one of these embodiments, the set of line-wise power balance equations (FT (W)) is defined as:

$$FT(W) = \begin{bmatrix} FF(W) \\ FS(W) \\ FA(W) \\ FB(W) \\ FP(W) \\ FQ(W) \end{bmatrix}$$

wherein: FF(W) is a vector of line based voltage functions in relation to each first end of each of the at least one transmission branch; FS(W) is a vector of line-based voltage function in relation to each second end of each of the at least one transmission branch; FA(W) is a vector of phase angle functions in relation to each first end of each of the at least one transmission branch; FB(W) is a vector of phase angle functions in relation to each second end of each of the at least one transmission branch; FP(W) is a vector of functions for bus-wise real power injections, and FQ(W) is a vector of functions for bus-wise reactive power injections.

In at least one of these embodiments, the problem vector (W') is defined as W'=[U, δ, PF, PS, QF, QS, PG, QG]$^T$, and the dependent vector (WD) is defined as WD=[U, δ, PF, PS, QF, QS]$^T$, and the control vector (WC) is defined as WC=[U, PG]$^T$, wherein: U is a vector of squared voltages magnitudes for each bus of each of the at least one transmission branch; δ is a vector of voltage angles for each bus of each of the at least one transmission branch; PF is a vector of active power flow in each first end of each of the at least one transmission branch; PS is a vector of reactive power flow in each second end of each of the at least one transmission branch; QF is a vector of reactive power flow in each first end of each of the at least one transmission branch; QS is a vector of reactive power flowing in each second end of each of the at least one transmission branch; PG is a vector of active power generation in each of the at least one transmission branches, and QG is a vector of reactive power generation in each of the at least one transmission branches.

In at least one of these embodiments, solving the set of line-wise power balance equations (FT(W')) to obtain the problem vector (W').

In at least one of these embodiments, the desired line-wise solution vector is defined as ST=[0 0 0 0 [PD] [QD]]$^T$, wherein: PD is a vector of active power demand in each of the at least one transmission branch, and PG is a vector of active power generation in each of the at least one transmission branch.

In at least one of these embodiments, the objective function $f_o(W')$ is a second-order power generation cost function expressed as:

$$f_o(W') = \sum_{g=1}^{NG} c1_g + c2_g \cdot PG_g + c3_g \cdot PG_g^2$$

wherein NG is a total number of power generators in the power system, $PG_g$ is the active power generation of a g-th power generator, $c1_g$ is a first constant for the g-th power generator, $c2_g$ is a second constant for the g-th power generator, and $c3_g$ is a third constant for the g-th power generator.

In at least one of these embodiments, the line-wise linear optimization formulation comprises a linearized objective function, a linearized set of equality constraints, and a linearized set of inequality constraints.

In at least one of these embodiments, the linearized objective function is expressed as:

$$\sum_{g=1}^{NG} [(c2_g + 2 \cdot c3_g \cdot PG_g) \cdot \Delta PG_g]$$

wherein $\Delta PG_g$ is a linear increment to the vector of active power generation.

In at least one of these embodiments, the linearized set of equality constraints is expressed as:

$$[J\ D]\Delta W' = \Delta ST$$

wherein J is a first jacobian matrix, D is a second Jacobean matrix, and ΔST is an incremental change to the line-wise solution vector, wherein ΔST=[0 0 0 0 0 0]$^T$.

In at least one of these embodiments, the method comprises solving the linear optimization formula using a linear programming method.

In at least one of these embodiments, determining whether a set of stopping criteria is satisfied comprises determining whether a stopping condition is satisfied, wherein the stopping conditioned is defined as:

$$\frac{|f_o(W'^k) - f_o(W'^{k-1})|}{|f_o(W'^k)|} \leq \gamma$$

where: γ is a pre-determining mismatch tolerance; $f_o(W'^k)$ is a first output of the objective function using values in the problem vector (W') determined in a current iteration (k) o; and $f_o(W'^{k-1})$ is a second output of the objective function using values in the problem vector (W') determined in a previous iteration (k−1).

In at least one of these embodiments, a set of stopping criteria is satisfied when a number of iterations of (b) to (d) is larger than a predetermined maximum number of iterations.

In at least one of these embodiments, a set of stopping criteria is satisfied when a set of equality and inequality constraints is satisfied, the set of equality constraints being defined by FT(W)=ST.

In at least one of these embodiments, determining initial values for the control vector (WC), further comprises: reading a set of data from at least one sensor operatively coupled to the power system.

In at least one of these embodiments, the method comprises: based on the control vector (WC), determining whether the power system is in a state of voltage stability by performing an N−1 contingency analysis, and when the power system is not in a stage of voltage stability implementing a remedial action to stabilize the power system where the remedial action comprises at least one of: shedding a load bus of the power system, increasing a power output at least one generator bus in the power system, re-activating at least one standby generator bus in the power system, and re-inserting standby transmission elements in the power system.

In accordance with another broad aspect of the teachings herein, there is provided at least one embodiment of a system for minimizing an objective function in respect of a power system, the power system comprising at least one transmission branch having a first end coupled to a first bus and a second end coupled to a second bus, the system comprising: at least one server comprising at least one processor, wherein the at least one server is configured to: (a) determine initial values for a control vector (WC); (b) use the control vector (WC) to solve a set of line-wise power balance equations (FT(W')) to obtain a problem vector (W'), wherein the problem vector (W') comprises the control vector (WC) and a dependent vector (WD); (c) use the problem vector (W') to solve a line-wise linear optimization formulation to determine an optimal incremental change to the control vector (ΔWC); (d) update the control vector (WC) based on the optimal incremental change in the control vector (ΔWC); and (e) based on the updating of the control vector (WC), determine whether the objective function is minimized by determining when a set of stopping criteria is satisfied, wherein when the set of stopping criteria is not satisfied, the at least one processor is configured to iteratively repeat (b) to (d) until the set of stopping criteria is satisfied.

In at least one of these embodiments, the set of line-wise power balance equations (FT(W)) is defined as:

$$FT(W) = \begin{bmatrix} FF(W) \\ FS(W) \\ FA(W) \\ FB(W) \\ FP(W) \\ FQ(W) \end{bmatrix}$$

wherein: FF(W) is a vector of line based voltage functions in relation to each first end of each of the at least one transmission branch; FS(W) is a vector of line-based voltage function in relation to each second end of each of the at least one transmission branch; FA(W) is a vector of phase angle functions in relation to each first end of each of the at least one transmission branch; FB(W) is a vector of phase angle functions in relation to each second end of each of the at least one transmission branch; FP(W) is a vector of functions for bus-wise real power injections, and FQ(W) is a vector of functions for bus-wise reactive power injections.

In at least one of these embodiments, the problem vector (W') is defined as W'=[U, δ, PF, PS, QF, QS, PG, QG]$^T$, and the dependent vector (WD) is defined as WD=[U, δ, PF, PS, QF, QS]$^T$, and the control vector (WC) is defined as WC=[U, PG]$^T$, wherein: U is a vector of squared voltages magnitudes for each bus of each of the at least one transmission branch; δ is a vector of voltage angles for each bus of each of the at least one transmission branch; PF is a vector of active power flow in each first end of each of the at least one transmission branch; PS is a vector of reactive power flow in each second end of each of the at least one transmission branch; QF is a vector of reactive power flow in each first end of each of the at least one transmission branch; QS is a vector of reactive power flowing in each second end of each of the at least one transmission branch; PG is a vector of active power generation in each of the at least one transmission branches, and QG is a vector of reactive power generation in each of the at least one transmission branches.

In at least one of these embodiments, solving the set of line-wise power balance equations (FT(W')) to obtain the problem vector (W').

In at least one of these embodiments, the desired line-wise solution vector is defined as ST=[0 0 0 0 [PD] [QD]]$^T$, wherein: PD is a vector of active power demand in each of the at least one transmission branch, and PG is a vector of active power generation in each of the at least one transmission branch.

In at least one of these embodiments, the objective function $f_o(W')$ is a second-order power generation cost function expressed as:

$$f_o(W') = \sum_{g=1}^{NG} c1_g + c2_g \cdot PG_g + c3_g \cdot PG_g^2$$

wherein NG is a total number of power generators in the power system, $PG_g$ is the active power generation of a g-th power generator, $c1_g$ is a first constant for the g-th power generator, $c2_g$ is a second constant for the g-th power generator, and $c3_g$ is a third constant for the g-th power generator.

In at least one of these embodiments, the line-wise linear optimization formulation comprises a linearized objective function, a linearized set of equality constraints, and a linearized set of inequality constraints.

In at least one of these embodiments, the linearized objective function is expressed as:

$$\sum_{g=1}^{NG} [(c2_g + 2 \cdot c3_g \cdot PG_g) \cdot \Delta PG_g]$$

wherein $\Delta PG_g$ is a linear increment to the vector of active power generation.

In at least one of these embodiments, the linearized set of equality constraints is expressed as:

$$[J\ D]\Delta W' = \Delta ST$$

wherein J is a first jacobian matrix, D is a second Jacobean matrix, and ΔST is an incremental change to the line-wise solution vector, wherein ΔST=[0 0 0 0 0 0]$^T$.

In at least one of these embodiments, the method comprises solving the linear optimization formula using a linear programming method.

In at least one of these embodiments, determining whether a set of stopping criteria is satisfied comprises determining whether a stopping condition is satisfied, wherein the stopping conditioned is defined as:

$$\frac{|f_o(W'^k) - f_o(W'^{k-1})|}{|f_o(W'^k)|} \le \gamma$$

where: γ is a pre-determining mismatch tolerance; $f_o(W'^k)$ is a first output of the objective function using values in the problem vector (W') determined in a current iteration (k); and $f_o(W'^{k-1})$ is a second output of the objective function using values in the problem vector (W') determined in a previous iteration (k−1).

In at least one of these embodiments, a set of stopping criteria is satisfied when a number of iterations of (b) to (d) is larger than a predetermined maximum number of iterations.

In at least one of these embodiments, a set of stopping criteria is satisfied when a set of equality and inequality constraints is satisfied, the set of equality constraints being defined by FT(W)=ST.

In at least one of these embodiments, determining initial values for the control vector (WC), further comprises: reading a set of data from at least one sensor operatively coupled to the power system.

In at least one of these embodiments, the system comprises: based on the control vector (WC), determining whether the power system is in a state of voltage stability by performing an N−1 contingency analysis, and when the power system is not in a stage of voltage stability implementing a remedial action to stabilize the power system where the remedial action comprises at least one of: shedding a load bus of the power system, increasing a power output at least one generator bus in the power system, re-activating at least one standby generator bus in the power system, and re-inserting standby transmission elements in the power system.

Other features and advantages of the present application will become apparent from the following detailed description taken together with the accompanying drawings. It should be understood, however, that the detailed description and the specific examples, while indicating preferred embodiments of the application, are given by way of illustration only, since various changes and modifications within the spirit and scope of the application will become apparent to those skilled in the art from this detailed description.

BRIEF DESCRIPTION OF THE DRAWINGS

For a better understanding of the various embodiments described herein, and to show more clearly how these various embodiments may be carried into effect, reference will be made, by way of example, to the accompanying drawings which show at least one example embodiment, and which are now described. The drawings are not intended to limit the scope of the teachings described herein.

FIG. 3A is an example generalized Jacobian matrix generated by the process of FIG. 2.

FIG. 4C is a table comparing the equations in a line-wise power flow formulation, as compared to a bus-wise power flow formulation.

FIG. 4D is a table comparing elements in line-wise Jacobian matrices, as compared to bus-wise Jacobian matrices.

FIG. 4E is a table comparing the size, condition, and sparsity factor of line-wise Jacobian matrices, as compared to bus-wise Jacobian matrices.

FIG. 5D is a table comparing a contingency analysis for an example 2835-bus system generating using a line-wise flow power analysis, as compared to a bus-wise power flow analysis.

FIG. 8 is a table comparing the results of solving the SLP algorithm, in FIG. 6, using a set of line-wise power balance equations, as compared to solving the SLP algorithm without using the set of line-wise power balance equations.

Figure 1:
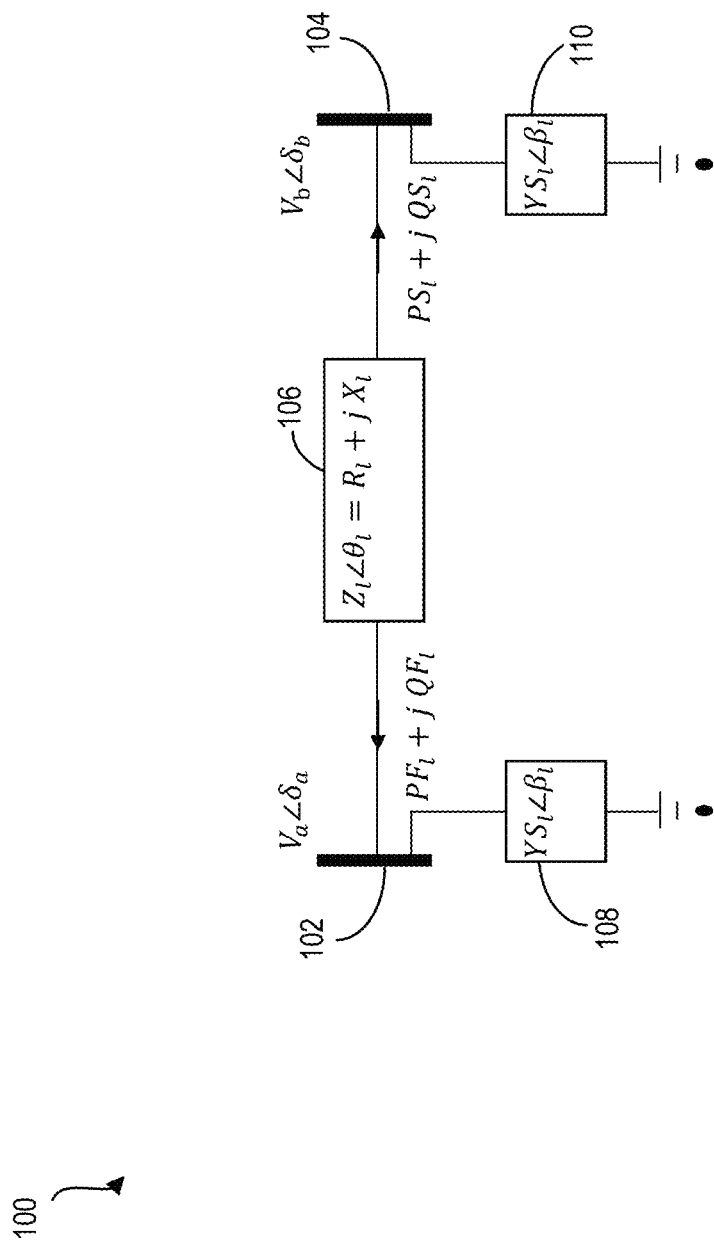
FIG. 1 is a pi-model of an example transmission branch in a power system.

Further aspects and features of the example embodiments described herein will appear from the following description taken together with the accompanying drawings.

DETAILED DESCRIPTION OF THE EMBODIMENTS

Various embodiments in accordance with the teachings herein will be described below to provide an example of at least one embodiment of the claimed subject matter. No embodiment described herein limits any claimed subject matter. The claimed subject matter is not limited to devices, systems or methods having all of the features of any one of the devices, systems or methods described below or to features common to multiple or all of the devices, systems or methods described herein. It is possible that there may be a device, system or method described herein that is not an embodiment of any claimed subject matter. Any subject matter that is described herein that is not claimed in this document may be the subject matter of another protective instrument, for example, a continuing patent application, and the applicants, inventors or owners do not intend to abandon, disclaim or dedicate to the public any such subject matter by its disclosure in this document.

It will be appreciated that for simplicity and clarity of illustration, where considered appropriate, reference numerals may be repeated among the figures to indicate corresponding or analogous elements or steps. In addition, numerous specific details are set forth in order to provide a thorough understanding of the example embodiments described herein. However, it will be understood by those of ordinary skill in the art that the embodiments described herein may be practiced without these specific details. In other instances, well-known methods, procedures and components have not been described in detail so as not to obscure the embodiments described herein. Also, the description is not to be considered as limiting the scope of the example embodiments described herein.

It should also be noted that the terms "coupled" or "coupling" as used herein can have several different meanings depending in the context in which these terms are used. For example, the terms coupled or coupling can have a mechanical, fluidic or electrical connotation. For example, as used herein, the terms coupled or coupling can indicate that two elements or devices can be directly connected to one another or connected to one another through one or more intermediate elements or devices via an electrical or magnetic signal, electrical connection, an electrical element or a mechanical element depending on the particular context. Furthermore, coupled electrical elements may send and/or receive data.

Unless the context requires otherwise, throughout the specification and claims which follow, the word "comprise" and variations thereof, such as, "comprises" and "comprising" are to be construed in an open, inclusive sense, that is, as "including, but not limited to".

It should also be noted that, as used herein, the wording "and/or" is intended to represent an inclusive-or. That is, "X and/or Y" is intended to mean X or Y or both, for example. As a further example, "X, Y, and/or Z" is intended to mean X or Y or Z or any combination thereof.

It should be noted that terms of degree such as "substantially", "about" and "approximately" as used herein mean a reasonable amount of deviation of the modified term such that the end result is not significantly changed. These terms of degree may also be construed as including a deviation of the modified term, such as by 1%, 2%, 5% or 10%, for example, if this deviation does not negate the meaning of the term it modifies.

Furthermore, the recitation of numerical ranges by endpoints herein includes all numbers and fractions subsumed within that range (e.g. 1 to 5 includes 1, 1.5, 2, 2.75, 3, 3.90, 4, and 5). It is also to be understood that all numbers and fractions thereof are presumed to be modified by the term "about" which means a variation of up to a certain amount of the number to which reference is being made if the end result is not significantly changed, such as 1%, 2%, 5%, or 10%, for example.

Reference throughout this specification to "one embodiment", "an embodiment", "at least one embodiment" or "some embodiments" means that one or more particular features, structures, or characteristics may be combined in any suitable manner in one or more embodiments, unless otherwise specified to be not combinable or to be alternative options.

As used in this specification and the appended claims, the singular forms "a," "an," and "the" include plural referents unless the content clearly dictates otherwise. It should also be noted that the term "or" is generally employed in its broadest sense, that is, as meaning "and/or" unless the content clearly dictates otherwise.

The headings and Abstract of the Disclosure provided herein are for convenience only and do not interpret the scope or meaning of the embodiments.

Similarly, throughout this specification and the appended claims the term "communicative" as in "communicative pathway," "communicative coupling," and in variants such as "communicatively coupled," is generally used to refer to any engineered arrangement for transferring and/or exchanging information. Examples of communicative pathways include, but are not limited to, electrically conductive pathways (e.g., electrically conductive wires, electrically conductive traces), magnetic pathways (e.g., magnetic media), optical pathways (e.g., optical fiber), electromagnetically radiative pathways (e.g., radio waves), or any combination thereof. Examples of communicative couplings include, but are not limited to, electrical couplings, magnetic couplings, optical couplings, radio couplings, or any combination thereof.

Throughout this specification and the appended claims, infinitive verb forms are often used. Examples include, without limitation: "to detect," "to provide," "to transmit," "to communicate," "to process," "to route," and the like. Unless the specific context requires otherwise, such infinitive verb forms are used in an open, inclusive sense, that is as "to, at least, detect," to, at least, provide," "to, at least, transmit," and so on.

In addition it should be noted that the example embodiments of the systems and methods described herein may be implemented as a combination of hardware or software. In some cases, the example embodiments described herein may be implemented, at least in part, by using one or more computer programs, executing on one or more programmable devices comprising at least one processing element, and a data storage element (including volatile memory, non-volatile memory, storage elements, or any combination thereof). These devices may also have at least one input device (e.g. a keyboard, mouse, touchscreen, or the like), and at least one output device (e.g. a display screen, a printer, a wireless radio, or the like) depending on the nature of the device.

Electrical power systems are typically formed from a network of transmission branches (e.g., lines, cables, or transformers) that connect, and transfer power between various busses (or nodes) located in the power system. In various cases, busses in a power system may be grouped according to one of three categories: (a) generator busses (e.g., generating stations); (b) load busses; and (c) slack busses (e.g., a reference generator bus).

In a power flow (PF) analysis of the power system, the power system is modelled using a set of power balance equations, and the equations are numerically solved to determine the current state of the power network. In various cases, for example, a PF analysis may be used to determine the voltage magnitudes and voltage phase angles at each power system bus, the real power generation at the slack bus, reactive power generation at all generator busses and the real and reactive power flow through each transmission branch.

As stated in the background, PF analysis has become an important tool in many aspects of power system engineering, and constitutes the basis for studies in power system optimization, power system planning, and voltage stability analysis. An increasing, wide-spread effort has accordingly been devoted in recent years to developing an efficient and accurate method for conducting a PF analysis.

In conventional PF analyses, a set of "bus-wise" (nodal) power balance equations is used to model a power system network. The bus-wise power balance equations rely on an admittance matrix, which relate the bus current injections to the voltages at each bus. In various cases, the bus-wise power balance equations are solved using any appropriate iterative numerical technique. For example, the bus-wise power balance equations may be solved using a Newton-Raphson (NR) technique, which computes a Jacobian matrix of the matrix of bus-wise power balance equations. In at least some cases, the bus-wise Jacobian matrix provides indirect information about the health and voltage stability of the power system. However, conventional bus-wise PF analyses suffer from a number of draw-backs.

First, in order to generate admittance matrices, advanced knowledge of the power system topology is required. This step adds to computational time required to complete Power Flow analysis.

Second, computing the bus-wise mismatch vector, in a Newton-Raphson technique, is a computationally-intensive process. Bus-wise power balance equations typically include a significant number of high-order non-linear terms (e.g., fourth-order and cubic terms), and many sinusoidal terms. Accordingly, determining the bus-wise mismatch vector is a computationally intensive process that results in slower performance for large power systems.

Third, computing the bus-wise Jacobian matrix, in a Newton-Raphson technique, is also a computationally-intensive process as it typically includes a significant number of high-order non-linear terms (e.g., fourth-order and cubic terms), all of which includes sinusoidal terms. Accordingly, the intensive computation required for computing the Jacobian matrix results in slower performance for large power systems.

Fourth, the bus-wise Jacobian matrix does not, without further computation, provide direct information about power flow in transmission lines, or sets of transmission lines, which are susceptible to voltage collapse. As such, determining power flow in transmission lines or determining the set of critical transmission lines in a power system using a bus-wise formulation requires additional computation time.

In view of the foregoing, and in accordance with various teachings provided herein, there is provided a system and method for performing a line-wise power flow analysis using a set of line-wise power balance equations. In various embodiments, the line-wise power flow analysis may be solved using any suitable numerical technique, including a Newton-Raphson (NR) technique.

As explained in further detail herein, the set of line-wise power balance (LWPB) equations are formulated in terms of the square of the bus voltages, which results in lower order equations with lower-order terms, as compared to the bus-wise formulation. The set of LWPB equations also include far fewer sinusoidal terms than the bus-wise equations. In view of the foregoing, solving the LWPB equations is a less-computationally-intensive process. In at least some embodiments, the line-wise power flow formulation is solved up to twice as fast as the bus-wise power flow formulation using an NR technique.

In various embodiments, as provided herein, the line-wise power flow (LPFW) formulation demonstrates stable numerical performance, monotonic convergence, high solution accuracy, and scales well for large power network systems.

In at least some embodiments, a line-wise Jacobian matrix is generated when solving the LPFW method using a Newton-Raphson technique. In various cases, the line-wise Jacobian matrix may provide direct information, i.e., without further computation, for transmission lines, or sets of transmission lines, which are most susceptible to voltage collapse. Accordingly, this allows for quick identification of critical transmission lines and for immediate corrective action to these transmission lines. In still yet other embodiments, the LPFW formulation may be used to quickly generate a contingency analysis for ranking the transmission lines in order of voltage collapse susceptibility.

In another aspect, in at least one example embodiment provided herein, the set of line-wise power balance equations may be used as equality constraints in an optimal power flow (OPF) formulation for solving an optimal power flow (OPF) problem.

The goal of solving an optimal power flow (OPF) problem is to minimize an objective function, such as a total power generation cost function, a transmission real power loss minimization function, or a voltage profile improvement function. In particular, solving an OPF problem has widespread applicability in power systems operations. For example, power system operators, who schedule the power demands of various loads in a system at frequent intervals, may routinely solve the OPF problem (i.e., as often as every 5 minutes) to determine the best operating schedule. Accordingly, it is desirable to have a method for solving the OPF problem that is highly efficient and requires minimal execution time (e.g., especially for applications that require solving the OPF problem at short repeated time intervals).

The conventional method for solving OPF problems has relied on the set of bus-wise power balance equations to form the equality constraints in the OPF problem. As stated previously, however, the bus-wise formulation suffers from a number of draw-backs, including high computational burden and slow execution times. The deficiencies of the bus-wise optimal power flow (BWOPF) formulation can accordingly yield non-optimal solutions, which may lead to economic loss (e.g., when attempting to minimize the total generation cost of a power system).

In accordance with various embodiments provided herein, there is accordingly provided a line-wise optimal power flow (LWOPF) formulation which relies on the set of line-wise power balance equations to form the equality constraints for solving the OPF problem. In at least some embodiments, explained in further detail herein, the LWOPF formulation may be solved using a successive linear programming (SLP) algorithm.

In various embodiments, owing to the lower order terms in LWPF equations in comparison to higher order terms in BWPF equations used for the equality constraints in an OPF problem, the use of the set of LWPF equations results in: (1) low-computational burden of the LWOPF formulation which results in the LWOPF method converging to an optimal solution in up to twice the speed as the conventional BWOPF formulation (due to using lower order terms in the computation), and (2) a lower order solution space (due to using lower order terms in the computation) whereby the LWOPF formulation consistently achieves a global optimal solution that equals or is better than that achieved by BWOPF.

Figure 9A:
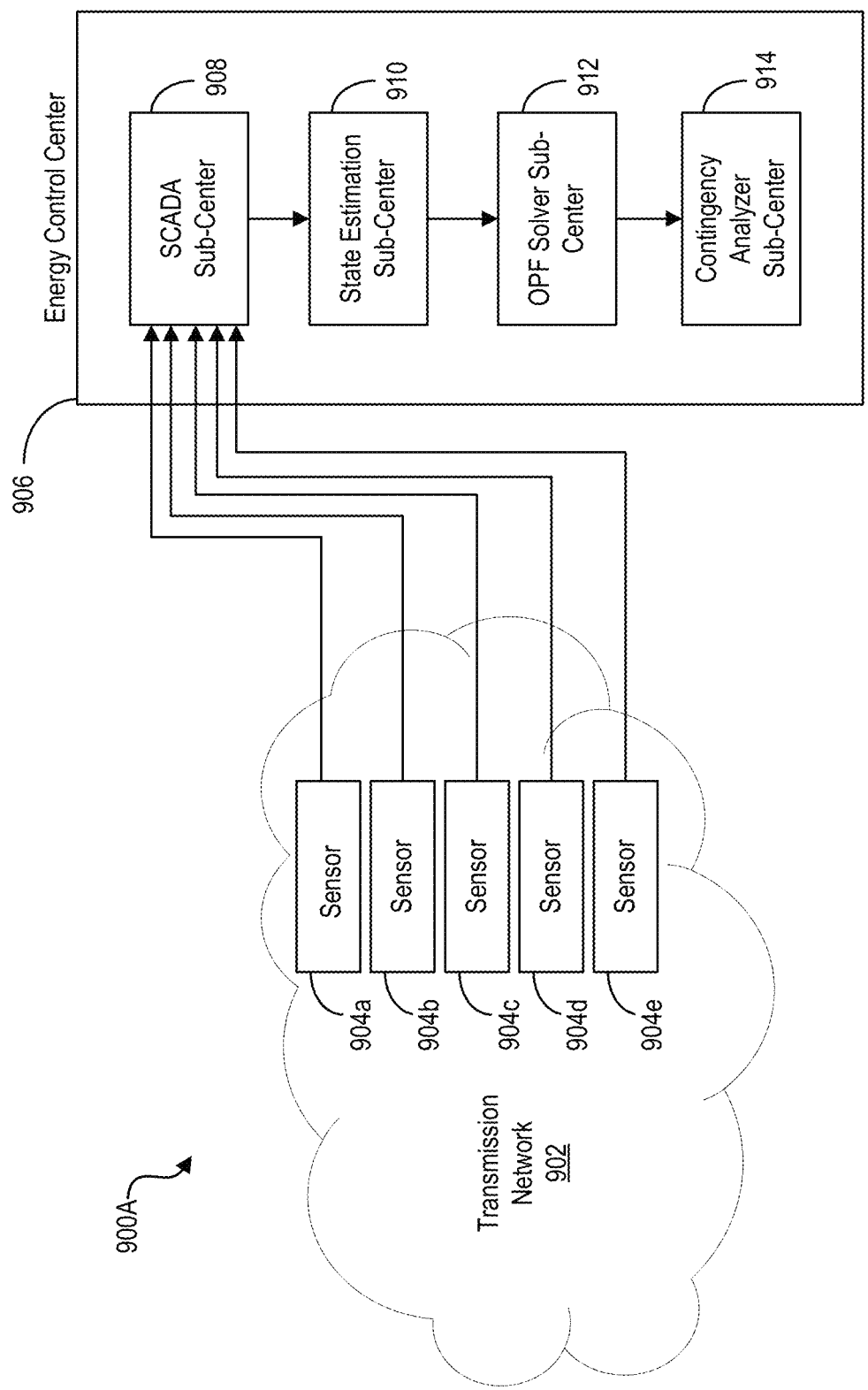
FIG. 9A illustrates a simplified block diagram for an example embodiment of a power system that can perform power flow analysis, in accordance with the teachings here.

Referring now to FIG. 9A, there is shown a simplified block diagram for an example embodiment of a power system 900A in which power flow analysis can be performed, in accordance with at least some embodiments described herein. The power flow analysis system 900A provides the environment in which the systems and/or methods described herein generally operate.

As shown, the system 900A generally has a transmission network 902 (e.g., a power system). The transmission network 902, may be for example, formed from a network of transmission branches (e.g., lines, cables, or transformers) that connect, and transfer power between various busses (or nodes) located in the network 902. In various cases, busses in the power network 902 may be either load busses or generator busses coupled to loads and generators, respectively. In various cases, the power network 902 may include one or more sensors 904a, 904b, 904c, 904d, and 904e. In various cases, sensors 904a-904e may be remote units which are installed on various equipment located in the transmission network 902, including power lines, transformers, cables, switching gears, loads, and generators. The sensors 904a-904e may accordingly sense and measure various parameters of the transmission network 902 (e.g., to measure real-time, or near-real time operating data). In at least some embodiments, sensors 904a-904e may include: (a) sensing elements, (b) analog-to-digital conversion systems for converting analog sensor readings into a digital output for sensed data comprising corresponding digital readings; (c) data processing systems for processing the sensed data; and (d) telecommunication systems to transmit the measured and/or processed data.

Data, or information, from sensors 904a-904e may be transmitted to an energy control center 906 via one or more transmission lines. In various cases, the transmission lines may be secure telemetry transmission lines. In other cases, the data from sensors 904a-904e may be transmitted over secure wireless channels. The sensors 904 may be configured to transmit the measured parameters in real-time, near real-time, at predefined time-intervals, or at a pre-defined frequencies.

The energy control center 906 may include a supervision control and data acquisition (SCADA) sub-center 908, a state estimation sub-center 910, an OPF solver sub-center 912, and a contingency analyzer sub-center 914, such as an N−1 contingency analyzer sub-center. In various cases, each of the sub-centers 908-914 may include one or more servers. For examples, additional servers may be used in each sub-center 908-914 to divide tasks to decrease computational time while additional servers may be used in each sub-center 908-914 for redundancy purposes to improve the robustness of the energy control center 906.

As shown, the SCADA sub-center 908 is configured to receive data transmitted by the one or more sensors 904a-904e. In at least some cases, the SCADA sub-center 908 is configured to process the data and present the data in a format accessible to a power system operator. Accordingly, the power system operator may gain insight into the current state of the power system.

State estimation sub-center 910 may receive the data sets and measurements generated by the SCADA sub-center 908, and may be configured to detect and replace bad data elements (e.g., corrupted or erroneous data) with a revised best estimate. In at least some cases, the state estimation sub-center 910 may also simply remove bad data elements. For example, methods for state estimation in power systems are described in: A. Monticelli, "Electric power system state estimation," in *Proceedings of the IEEE*, vol. 88, no. 2, pp. 262-282, February 2000.

The data set generated by the state estimation sub-center 910 may then be transmitted to the OPF solver sub-center 912. In accordance with the teachings provided herein, the OPF solver sub-center 912 may use the data to solve a line-wise optimal power flow problem. The solution to the line-wise OPF problem may provide the power system operator with various information including, but not limited to, an optimal schedule for generating power in the power system. For examples, there may be several generators in the power system and the optimal schedule for generating power dictates the amount of power that each generator can generate while not being overloaded while also being able to deal with any transient increases in load.

In at least some embodiments, the optimal schedule generated by solving the OPF problem may be then passed to the N−1 contingency analyzer 914. The N−1 contingency analyzer 914 may be configured to perform a line-wise power flow analysis for each case where a transmission line experiences voltage collapse (e.g., "N" power flow analysis iterations for a power system having "N" transmission lines where a unique one of the "N" transmission lines undergoes voltage collapse). As explained herein, based on the contingency analysis, it may then be determined if the power system is in a state of voltage instability. For example, if in an iteration of the contingency analysis, it is determined that the power system is in a state of voltage instability, the contingency analysis may be stopped, and one or more of a number of remedial actions may be taken, including: (a) re-optimizing the distribution of power across the transmission branches (e.g., solving an OPF problem as explained herein); (b) shedding load busses in the power system; (c) increasing the power generation for power generators in the power system, or otherwise, activating new power generators; and (d) re-inserting standby transmission elements in the power system such as transformers. Once the remedial action is complete, the OPF solver sub-center 912 may then re-optimize the power system based on the change of configuration resulting from the remedial action, and the contingency analysis may be then repeated to determine if the power system is in a state of voltage stability.

Figure 9B:
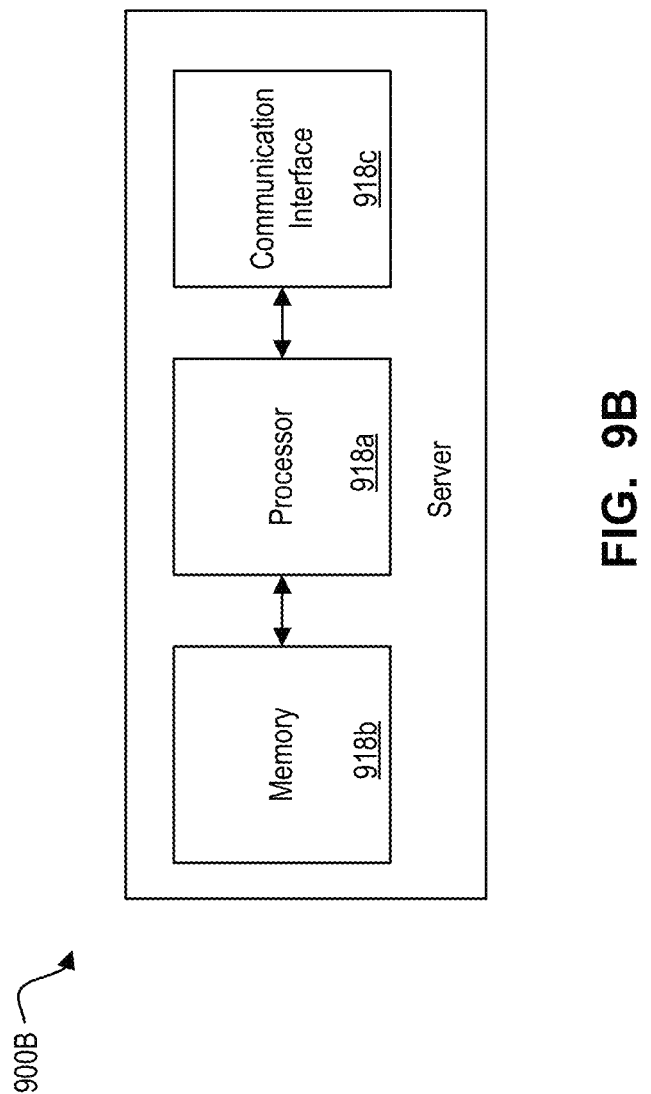
FIG. 9B is a simplified block diagram for an example embodiment of a server, in accordance with the teachings herein.

Referring now to FIG. 9B, there is shown a simplified diagram of an example server 900B, in accordance with at least some embodiments. The example server 900B may be used, for example, in any one of the sub-centers 908-914 of FIG. 9A.

As shown, the server 900B may generally include a processor 918a in communication with a memory 918b and a communication interface 918c.

The processor 918a may be configured to execute a plurality of instructions to control and operate the various components of the server 900B. Processor 918a may also be configured to receive information from the various components of server 900B and to make specific determinations using this information. The determinations may then be transmitted to the memory device 918b and/or the communication interface 918c. In various embodiments, the processor 918a may be configured to perform the operations of any one of the sub-centers 908-914 of FIG. 9A. In various cases, the processor 918a may be formed from an application-specific integrated circuit (ASIC), a digital signal processing (DSP) circuit, or any other suitable circuit.

Memory 918b may be, for example, a non-volatile read-write memory which stores computer-executable instructions and data, and a volatile memory (e.g., random access memory) that may be used as a working memory by processor 918a.

In various embodiments, communication interface 918c may be configured to receive data from one or more components of system 900A of FIG. 9A. In various cases, the communication module 918c may, for example, comprise a wireless transmitter or transceiver and antenna. In other cases, the communication interface 918c may be configured for wired communication.

Figure 10:
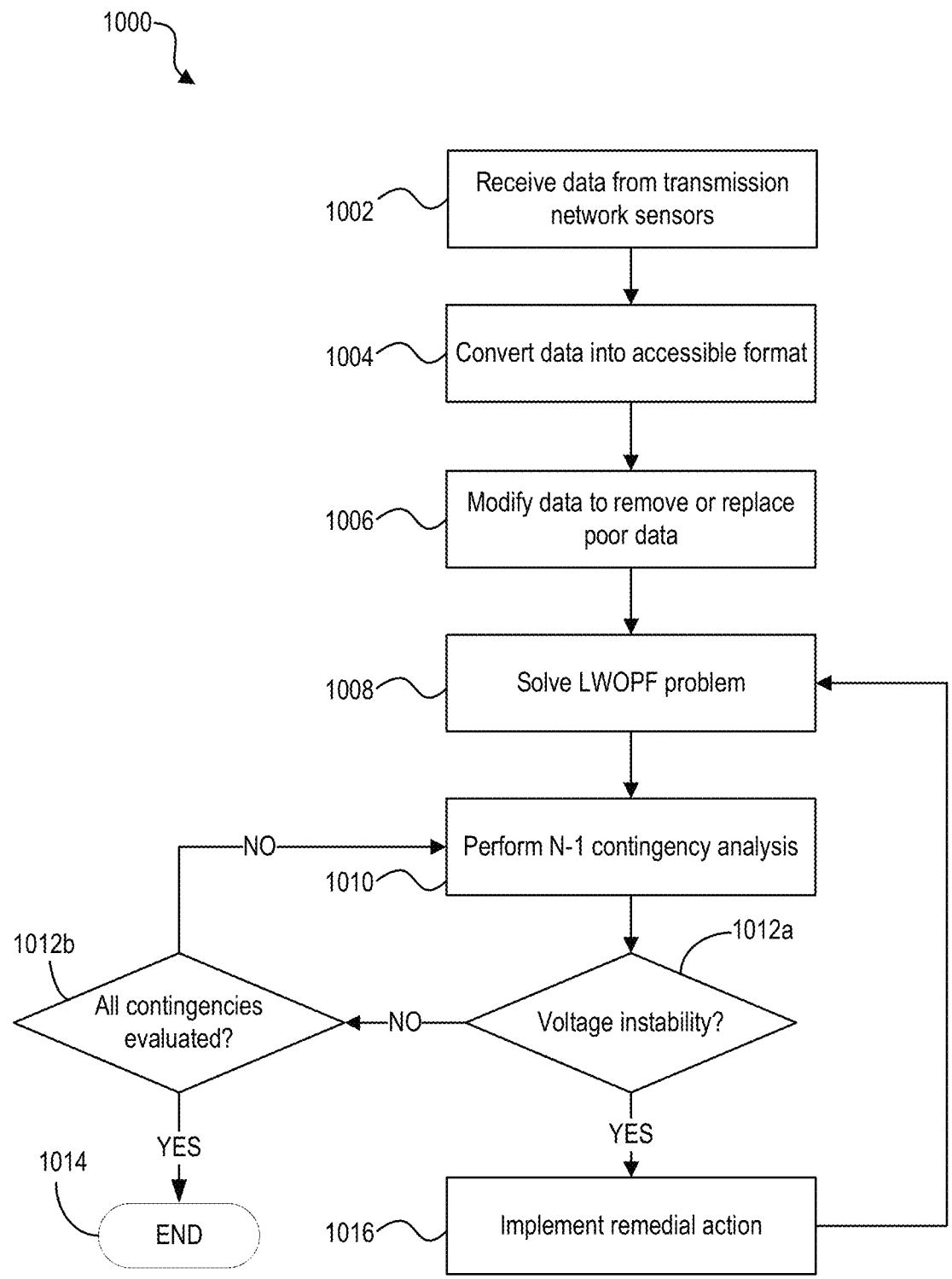
FIG. 10 is a process flow diagram for an example embodiment of a method for monitoring the state of a power system, in accordance with the teachings herein.

Referring now to FIG. 10, there is shown a process flow for an example embodiment of a method 1000 for monitoring the state of a power system.

At act 1002, the SCADA sub-center 908, of system 900A, may receive measurement data from one or more sensors 904a-904e in the transmission network 902.

At act 1004, the SCADA sub-center 908 may be configured to process the data and present the data in a format accessible to a power system operator.

At act 1006, the state estimation sub-center 910 may receive the data sets and measurements generated by the SCADA 908, and may be configured to detect and replace bad data elements (e.g., corrupted or erroneous data) with a revised best estimate. In at least some cases, the state estimation sub-center 910 may also simply remove bad data elements, as previously described.

At act 1008, the complete data set generated by the state estimation sub-center 910 may then be transmitted to the OPF solver sub-center 912. In accordance with the teachings provided herein, the OPF solver sub-center 912 may use the data to solve a line-wise optimal power flow (LWOPF) problem. The solution to the line-wise OPF problem may be used by the power the system operator to determine an optimal schedule for generating power in the power system 900A.

At act 1010, the optimal schedule generated by solving the OPF problem may be then passed to the N−1 contingency analyzer 914. The N−1 contingency analyzer 914 may be configured to perform a line-wise power flow (PF) analysis, e.g., one line-wise PF analysis for each contingency of each of the "N" elements of a power system, in order to check the health of the power system (e.g., voltage stability) after each of those contingencies (e.g., "N" power flow analysis iterations for a power system having "N" elements such as generators, transmission lines, transformers, cables, etc.), as previously described.

After each iteration of the contingency analysis, it is determined, at act 1012a whether the power system is in a state of voltage instability. If the power system is determined not to be in a state of voltage instability at act 1012a, it is then determined at act 1012b whether all iterations of the contingencies analysis are complete. If the contingency analysis is determined to be complete at act 1012b, then the method 1000 is completed at act 1014. Alternatively, if it is determined at act 1012b that the contingency analysis is not complete, then method 1000 may return to act 1010 to complete the remaining iterations of the contingency analysis.

If the power system is determined not be voltage stable at act 1012a for a given iteration of the contingency analysis, the contingency analysis may be stopped and a remedial action may be taken at act 1016 to ameliorate the voltage instability, including one or more of: (a) re-optimizing the distribution of power across transmission branches (e.g., solving an OPF problem as explained herein); (b) shedding load busses in the power system; (c) increasing the power generation for power generators in the power system, or otherwise, activating new power generators; and (d) re-inserting standby transmission elements in the power system such as transformers. Once the remedial action is complete, the method 1000 may return to act 1008 wherein the LWOPF problem is solved again (e.g., to re-optimize the system in view of the change of configuration resulting from the remedial action), and the N−1 contingency analysis at act 1010 is repeated using the new LWOPF solution.

Referring now to FIG. 1, there is shown a pi-model of an example transmission branch 100 in a power system.

As shown, the example transmission branch 100 couples a first bus 102 to a second bus 104. The first bus 102 and the second bus 104 may be characterized, for example, as load busses, generator busses, or slack busses. The transmission branch 100 may include a series impedance element 106. In the illustrated embodiment, the impedance of element 106 may be expressed according to Equation (1):

$$Z_l \angle \theta_l = R_l + jX_l \tag{1}$$

where $Z_l \angle \theta_l$ is the complex impedance of the element 106, $R_l$ is the real component of the impedance, $X_l$ is the imaginary component of the impedance, and the subscript "l" denotes the "l"-th transmission branch in a power system that includes a plurality of transmission branches. In a power system that includes "NT" transmission lines, each term in Equation (1) resolves into a vector which includes values over the range of l=1 to NT. It should be noted that the term "power system" may be used interchangeably with the term "power network".

Transmission branch 100 may also include shunt elements 108, 110 ($YS_l \angle \beta_l$) of the pi-model of the transmission branch 100. In various cases, the transmission branch 100 may be a line, a cable, or a transformer.

The power in the first end of transmission branch 100 (e.g., proximate bus 102) may be characterized according to Equation (2):

$$SF_l \angle \emptyset F_l = PF_l + jQF_l \tag{2}$$

where $SF_l \angle \emptyset F_l$ is the complex power in the first end, $PF_l$ is the active power in the first end, and $QF_l$ is the reactive power in the first end.

Similarly, the power in the second end of transmission branch 100 may be characterized according to Equation (3):

$$SS_l \angle \emptyset S_l = PS_l + jQS_l \tag{3}$$

where $SS_l \angle \emptyset S_l$ is the complex power in the second end, $PS_l$ is the active power in the second end, and $QS_l$ is the reactive power in the second end.

The complex voltage at the first bus 102 may be expressed by the term $V_a \angle \delta_a$, and the complex voltage in the second bus 104 may be expressed by the term $V_b \angle \delta_b$. The power flow in the first end of transmission branch 100, may then be accordingly determined according to Equation (4), based on the voltage difference between the first bus 102 and second bus 104. Equation (4) may be re-arranged to generate Equation (5).

$$V_a \angle \delta_a - V_b \angle \delta_b = \left( \frac{SS_l \angle \phi_l S_l}{V_b \angle \delta_b} \right)^* \cdot Z_l \angle \theta_l \tag{4}$$

$$V_a \angle \delta_a \cdot (V_b \angle \delta_b)^* - V_b^2 = (SS_l \angle \phi_l S_l)^* \cdot Z_l \angle \theta_l \tag{5}$$

The real and imaginary components of Equation (5) may be separated to generate Equations (6) and (7), respectively.

$$V_a \cdot V_b \cdot \cos(\delta_a - \delta_b) = PS_l \cdot R_l + QS_l \cdot X_l + V_b^2 \tag{6}$$

$$V_a \cdot V_b \cdot \sin(\delta_a - \delta_b) = PS_l \cdot X_l + QS_l \cdot R_l \tag{7}$$

Equations (6) and (7) may then be divided to generate Equation (8), which can be re-arranged to generate Equation (9):

$$(PS_l \cdot R_l + QS_l \cdot X_l + V_b^2) \cdot \tan(\delta_a - \delta_b) = PS_l \cdot X_l + QS_l \cdot R_l \tag{8}$$

$$(PS_l \cdot R_l + QS_l \cdot X_l + U_b^2) \cdot \tan(\delta_a - \delta_b) - PS_l \cdot X_l + QS_l \cdot R_l = 0 \tag{9}$$

where $U_b$ expresses the square of the voltage magnitude at first bus 104 ($V_b^2$) of the transmission branch 100.

Equation (9) may herein express a "phase angle function" for the second end of the transmission branch 100 ($FB_l$). When Equation (9) is applied to a power system having "transmission branches, a vector of phase angle functions is generated (e.g., ∀l=1 to NT).

In order to remove sinusoidal terms, Equations (6) and (7) may be added to generate Equation (10):

$$U_b^2 + 2 \cdot U_b \left( PS_l \cdot R_l + QS_l \cdot X_l - \frac{U_a}{2} \right) + SS_l \cdot Z_l^2 = 0 \tag{10}$$

where $U_a$ expresses the square of the voltage magnitude at the first bus 102 ($V_a^2$) of the transmission branch 100. Equation (10) may herein express a "line-based voltage function" for the second end of the transmission branch 100 ($FS_l$), or a vector of "line-based voltage functions" (e.g., ∀l=1 to NT).

The power flow in the second end of the transmission branch 100 may be similarly expressed in accordance with Equation (11).

$$V_b \angle \delta_b - V_a \angle \delta_a = \left( \frac{SF_l \angle \phi_l F_l}{V_a \angle \delta_a} \right)^* \cdot Z_l \angle \theta_l \tag{11}$$

Equations (12) to (17), below, are generated from Equation (11) in an identical manner as Equations (5) to (10) were generated from Equation (4), respectively.

$$V_b \angle \delta_b \cdot (V_a \angle \delta_a)^* - V_a^2 = (SF_l \angle \phi_l F_l)^* \cdot Z_l \angle \theta_l \tag{12}$$

$$V_b \cdot V_a \cdot \cos(\delta_b - \delta_a) = PF_l \cdot R_l + QF_l \cdot X_l + U_a \tag{13}$$

$$V_b \cdot V_a \cdot \sin(\delta_b - \delta_a) = PF_l \cdot X_l + QF_l \cdot R_l \tag{14}$$

-continued $$(PF_l \cdot R_l + QF_l \cdot X_l + U_a) \cdot \tan(\delta_a - \delta_b) = PS_l \cdot X_l + QS_l \cdot R_l \quad (15)$$

$$(PF_l \cdot R_l + QF_l \cdot X_l + U_a) \cdot \tan(\delta_a - \delta_b) - PS_l \cdot X_l + QS_l \cdot R_l = 0 \quad (16)$$

$$U_a^2 + 2 \cdot U_a \left( PF_l \cdot R_l + QF_l \cdot X_l - \frac{U_b}{2} \right) + SF_l \cdot Z_l^2 = 0 \quad (17)$$

Equation (16) may herein express a "phase angle function" for the first end of transmission branch 100 ($FA_l$), and Equation (17) may herein express a "line based voltage function" for the first end of the transmission branch 100 ($FF_l$).

The transmission branch 100 may also be characterized according to the following bus-wise power equations, expressed in matrix form in Equations (18) and (19):

$$[M]\begin{bmatrix} PF \\ PS \end{bmatrix} - U \cdot GS = PD - PG \quad (18)$$

$$[M]\begin{bmatrix} QF \\ QS \end{bmatrix} + U \cdot BS = QD - QG \quad (19)$$

where [M] is a modified bus incidence matrix, GS and BS express the bus conductance and susceptance elements from loads and pi-models of transmission branches, PG and PD are vectors of bus-wise active power generation and demand, respectively, and QG and QD are vectors of bus-wise reactive power generation and demand, respectively. Equation (18) may accordingly herein express a function for bus-wise real power injections (FP), while Equation (19) may herein express a function for bus-wise reactive power injections (FQ).

In various cases, the modified bus incidence matrix [M] is a matrix having dimensions NB×2·NT, wherein "NB" is the total number of busses in the power system (e.g., load and generator busses), and "NT" is the total number of transmission branches in the power system. The matrix [M] has a value of "1" for $[M]_{a,l}$ and $[M]_{b,NT+l}$, wherein "a" denotes the first bus 102 of the "l-th" transmission branch, and "b" denotes the second bus 104 of the "l-th" transmission branch, otherwise the values of the matrix [M] are equal to zero.

In view of the foregoing and in accordance with the teachings herein, a power system having a total number of transmission branches (NT) may be modeled using the set of line-wise power balance (LWBP) equations expressed in Equation (9), (10), (16), (17), (18), and (19), and combined in accordance with Equation (20):

$$\begin{bmatrix} FF_l(W) \\ FS_l(W) \\ FA_l(W) \\ FB_l(W) \\ FP_b(W) \\ FQ_c(W) \end{bmatrix} = \begin{bmatrix} 0 \\ 0 \\ 0 \\ 0 \\ [PD - PG] \\ [QD - QG] \end{bmatrix} \quad (20)$$

$(\forall l = 1 \text{ to } NT; \forall b = 1 \text{ to } NB - 1; \forall c = 1 \text{ to } NLB)$ where the set of LWPB equations (FT(W)), on the left side of Equation (20), is a function of a problem vector W=[U δ PF PS QF QS], and wherein the vector [0 0 0 0 [PD−PG] [QD−QG]]$^T$ defines the target solution vector (ST) for the set of LWBP equations (FT(W)). Further, "NB" defines the number of busses in the power system (load and generator busses), and "NLB" defines the number of load busses in the power system. Accordingly each of FF(W), FS(W), FA(W), and FB(W) is a vector which has "NT" equations, FP(W) is a vector that includes "NB−1" equations (e.g., all busses except the slack bus), and FQ(W) is a vector which includes "NLB" equations.

The number of equations in Equation (20) is expressed as (4·NT+NB−1+NLB), and the number of variables in Equation (20) is expressed as (4·NT+NB−1+NLB). The variables in Equation (20) may be grouped into a set of known and unknown variables, which vary based on the bus type. Table 1, below, summarizes the known and unknown variables in respect of each of the generator, load, and slack busses.

TABLE 1

Set of known and unknown variables for different bus-types

| | Knowns | Unknowns |
|---|---|---|
| Slack Bus | V | PT = PG − PD |
| | δ | QT = QG − QD |
| Generator Bus | PT = PG − PD | QT = QG − QD |
| | V | δ |
| Load Bus | PT = −PD | V |
| | QT = −QD | δ |

As shown, the known variables in Equation (20) include: (a) the voltage magnitude and phase angle of the slack bus; (b) the real power injection and voltage magnitudes for all of the generator busses; and (c) the real and reactive power injection at the load busses. Conversely, the unknown variables in Equation (20) include: (a) the real and reactive power injections at the slack busses; (b) the bus voltage angles and reactive power injections at the generator busses; and (c) the voltage magnitudes and phase angles at the load busses. The number of unknown variables in Equation (20) may be expressed as (4·NT+NB−1+NLB). Table 2, below, summarizes the number of equations in Equation (20) which require solving, and the number of unknown variables in each equation.

TABLE 2

Number of equations requiring solving in Equation (20)

| Equations | Number | Unknowns | Number |
|---|---|---|---|
| FF(W) | NT | PF | NT |
| FS(W) | NT | PS | NT |
| FA(W) | NT | QF | NT |
| FB(W) | NT | QS | NT |
| FP(W) | NB − 1 | δ | NB − 1 |
| FQ(W) | NLB | V | NLB |

In conducting a power flow analysis, Equation (20) may be solved for the unknown variables. In particular, and in various cases, Equation (20) may be solved using an iterative numerical technique, such as a multi-variate Newton-Raphson (NR) technique. As explained herein, the solution to the power flow analysis may provide insights into the current state of the power system, as well as any deficiencies in the power system (e.g., voltage collapse in one or more critical transmission lines). In various cases, the solution to Equation (20) identifies: (a) the square of the voltage magnitudes at each load bus; (b) the voltage phase angle at all busses, with the exception of the slack bus; and (c) the real and reactive powers at the first and second end of each transmission branch.

It will be appreciated from Equation (20), that the set of LWBP equations has been formulated in respect of the square of the bus voltage magnitudes ($U_a$, $U_b$), rather than the voltage magnitudes ($V_a^2$, $V_b^2$). Accordingly, the LWBP equations are expressed using low-order terms (e.g., $U_a^2$ rather than $V_a^4$). In particular, Equations (18) and (19) (FP(W), FQ(W)) are now expressed in linear terms, rather than quadratic terms. The LWBP equations also include minimal sinusoidal terms, with the exception of Equations (18) and (19). This is in contrast to the conventional bus-wise formulation, which includes an abundance of non-linear equations with high-order terms (e.g., fourth-order and cubic), and many sinusoidal functions. As explained in further detail herein, the use of linear equations, low-order terms, and minimal sinusoidal functions, allows the power flow analysis to be solved more quickly using the set of LWPB equations.

Figure 2:
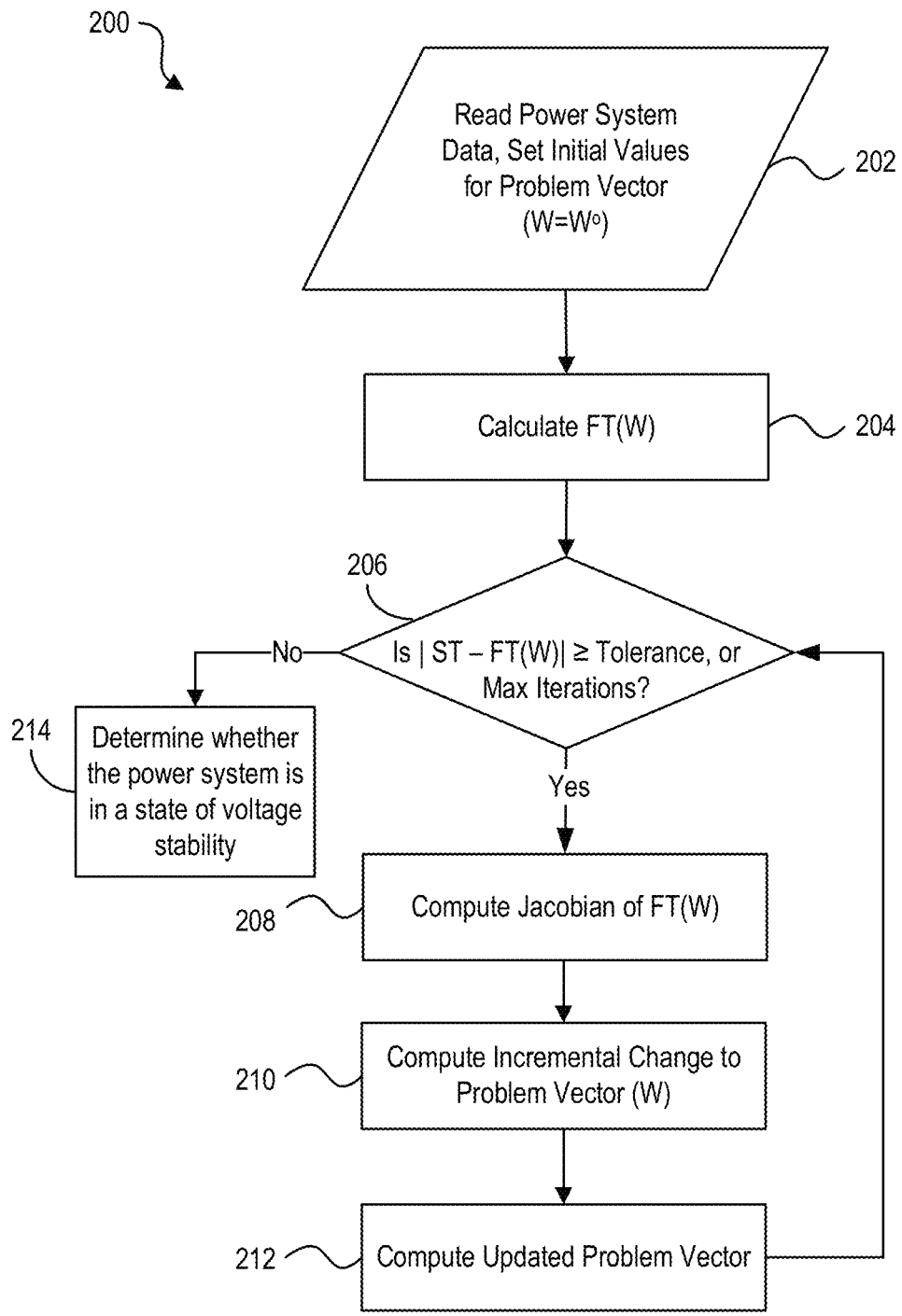
FIG. 2 is a process flow diagram showing an example embodiment of a process for performing a line-wise power flow analysis.

Referring now to FIG. 2, there is shown an example process flow for a method 200 for solving Equation (20) using an iterative Newton-Raphson technique. In various cases, the method 200 may be implemented using at least one processor 918a associated with the example server 900B of FIG. 9B.

At act 202, the current power system data is read. For example, in reference to Table 1, the known values for each bus in the power system may be read from the sensors 904a-904e in system 900A of FIG. 9A. In at least some embodiments, the unknown values may be initialized to pre-determined initialization values (e.g., voltages at load busses are initialized to 1.0 per unit, and phase angles of all voltage phase angles are initialized to zero). Based on the power system data readings, and the initialized values, an initialized problem vector ($W°$) is generated based on known measured values for some variables and initialization values for other variables that have an unknown value.

At act 204, the power system is modeled using the set of LWPB equations (FT(W)) developed in the left-side of Equation (20). The set of LWBP is then solved using the values determined for the problem vector (W). In the first iteration of method 200, the set of LWPB is solved using the initialized problem vector ($W°$).

At act 206, the difference between the target solution vector (ST), and the solution to the LWPB equations (FT(W)) (i.e., resolved in act 204), is determined. If the difference is below a pre-determined tolerance threshold, the method 200 proceeds to act 214. In various cases, the tolerance threshold is substantially zero. When the method 200 proceeds to act 214, the method 200 is complete and the values for the problem vector (W) are determined to reflect the current state of the power system. In at least some embodiments, at act 214, it may be determined from the values of the problem vector (W) whether the power system is in a state of voltage stability (e.g., a transmission branch is susceptible to voltage collapse, as explained in further detail herein). In other embodiments, the method 200 may also proceed to act 214 where a pre-defined maximum number of iterations of method 200 has been exceeded. In various cases, the maximum number of iterations may be pre-set by a power system operator, and may be in the range of three to seven iterations. In other cases, where the difference at act 206 is not below the pre-determined tolerance threshold, the method 200 may continue to act 208.

At act 208, a Taylor's series expansion of the set of LWPB equations (FT(W)) is determined. In at least some embodiments, the Taylor's series expansion is a first-order derivative expansion, which is expressed according to Equation (21):

$$FT(W) + \left[\frac{\partial FT(W)}{\partial W}\right] \cdot \Delta W = ST \quad (21)$$

where $$\left[\frac{\partial FT(W)}{\partial W}\right]$$

is the Jacobian of the set of LWPB equations (FT(W)), and $\Delta W$ is an incremental change to the problem vector (W), wherein $\Delta W = [\Delta U \ \Delta \delta \ \Delta PF \ \Delta PS \ \Delta QF \ \Delta QS]$. Equation (21) may be accordingly re-arranged to solve for the incremental problem vector ($\Delta W$), in accordance with Equation (22).

$$\Delta W = \left[\frac{\partial FT(W)}{\partial W}\right]^{-1} \cdot [ST - FT(W)] \quad (22)$$

In order to solve Equation (22), the Jacobian of the set of the LWPB equations (FT(W)) must be first determined.

Referring now briefly to FIG. 3A, there is shown an example Jacobian matrix 300A for the set of LWPB equations (FT(W)) in Equation (20).

As shown, the Jacobian matrix 300A includes a number of sub-matrices, which represent different partial differentials with respect to different variables in the problem vector (W). The overall dimensions of the matrix 300A may be expressed as (4·NT+NB−1+NLB)×(4·NT+NB−1+NLB), wherein "NT" is the total number of transmission lines in the power system, "NB" is the total number of power system busses, and "NLB" is the total number of load busses.

In particular, the Jacobian matrix 300A includes a number of sub-matrices which are null as a result of the specific partial differential, including:

$$\left[\frac{\partial FF}{\partial \delta}\right], \left[\frac{\partial FF}{\partial PS}\right], \left[\frac{\partial FF}{\partial QS}\right], \left[\frac{\partial FS}{\partial \delta}\right], \left[\frac{\partial FS}{\partial PF}\right], \left[\frac{\partial FF}{\partial QF}\right], \left[\frac{\partial FA}{\partial PS}\right],$$

$$\left[\frac{\partial FA}{\partial QS}\right], \left[\frac{\partial FB}{\partial PF}\right], \left[\frac{\partial FB}{\partial QF}\right], \left[\frac{\partial FP}{\partial \delta}\right], \left[\frac{\partial FP}{\partial QF}\right], \left[\frac{\partial FP}{\partial QS}\right], \left[\frac{\partial FQ}{\partial \delta}\right],$$

$$\left[\frac{\partial FQ}{\partial PF}\right], \text{and } \left[\frac{\partial FQ}{\partial PS}\right].$$

Figure 3B:
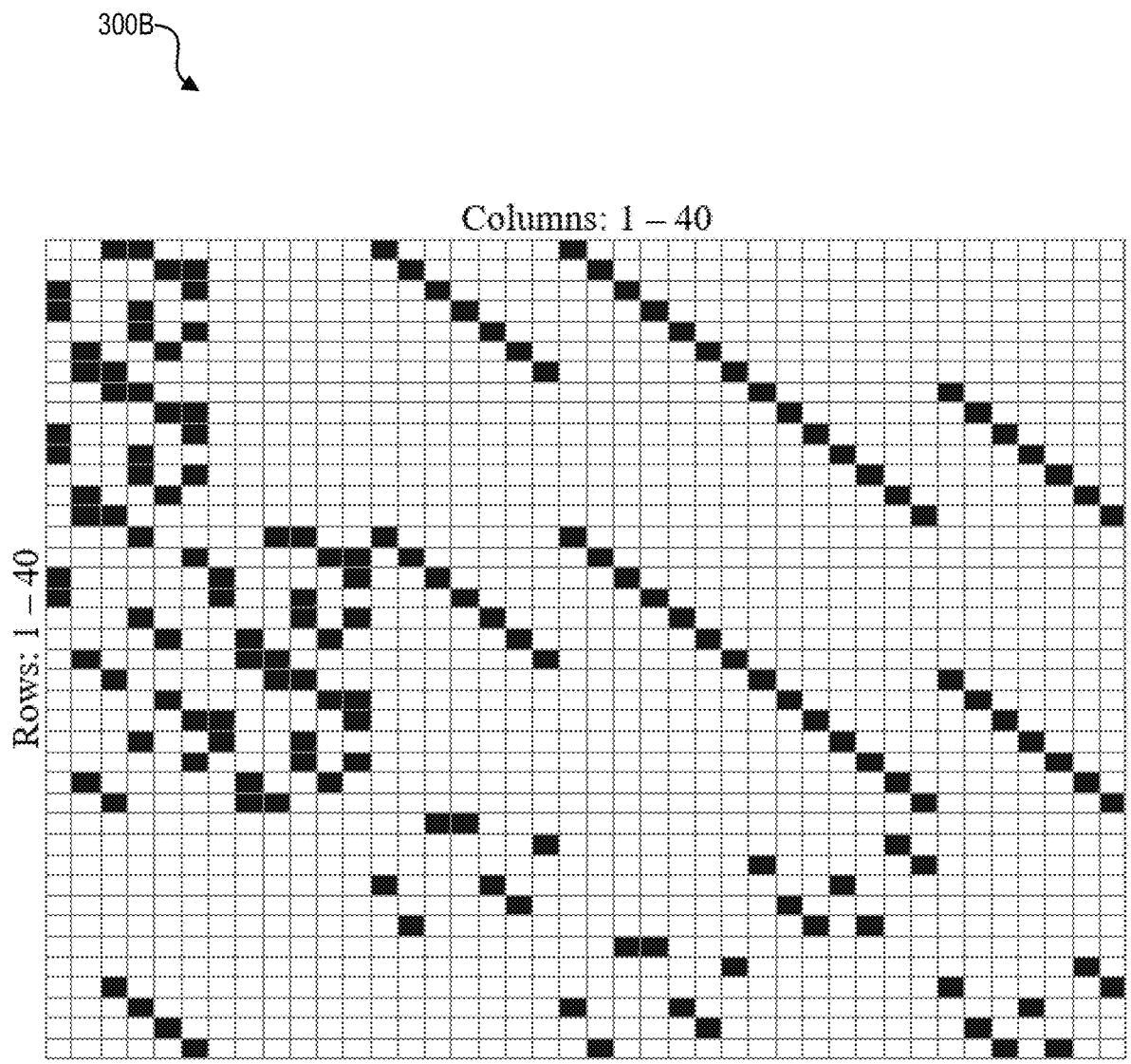
FIG. 3B is an example Jacobian matrix, generated by the process of FIG. 2, for a 6-bus power system.

Referring now to FIG. 3B, there is shown an example Jacobian matrix 300B generated for a 6-bus power system. As shown, the Jacobian matrix 300B includes 40 rows and 40 columns and is otherwise highly sparse, with the non-zero elements being shown in black. In particular, the highly sparse nature of the line-wise Jacobian 300B results from the large number of null sub-matrices. In various cases, the high sparse nature of the line-wise Jacobian allows the Jacobian to be computed quickly for large power system, while occupying minimal storage memory capacity on a processing system (e.g., memory 918b of server 900B in FIG. 9B).

Referring now back to FIG. 2, at act 210, Equation (22) is solved for the incremental change to the problem vector ($\Delta W$) using the inverse of the Jacobian matrix computed at act 208.

At act 212, using the incremental change to the problem vector ($\Delta W$) determined at act 210, an updated problem vector (W) is calculated in accordance with Equation (23).

$$W = W + \Delta W \quad (23)$$

In various cases, where a generator reactive power reaches a limit, the generator is set to be a load bus. In particular, if the problem vector (W) yields a reactive power output for a generator bus that is higher than its capacity, the generator bus is switched to a load bus, wherein its real and reactive power output are expressed as negative values of a load and are solved to determine the voltage magnitude and voltage phase angle.

The method 200 may then return to act 206, and may iteratively repeat until either the tolerance condition is met, or otherwise, the maximum iterations is exceeded.

Table 3, below, compares the execution times and number of iterations required to solve the set of LWBP equations using method 200, as compared to solving a set of conventional bus-wise power balance (BWPB) equations using a Newton-Raphson (NR) technique. The data in Table 3 assumes a tolerance threshold of $10^{-5}$ per unit (i.e., at act 206 of method 200), and further assumes that loads are modeled as constant Mega Volt Ampere (MVA) loads, and lines and transformers are modeled as pi-models considering their shunt admittance elements.

TABLE 3

Execution times and number of iterations for solving a set of LWPB equations vs solving a set of BWPB equations using a Newton-Raphson technique

|  | Traditional bus-wise NR | | Proposed method (Line-wise NR) | | Execution time of line-wise method as percentage of bus-wise method |
|---|---|---|---|---|---|
|  | Time (milli-seconds) | No. of Iterations | Time (milli-seconds) | No. of Iterations |  |
| 6-bus | 4.0 | 3 | 4.0 | 4 | 100.00% |
| 14-bus | 9.0 | 2 | 4.0 | 3 | 44.44% |
| 57-bus | 22.0 | 3 | 8.0 | 4 | 36.36% |
| 118-bus | 31.0 | 3 | 15.0 | 3 | 48.39% |
| 582-bus | 332.0 | 6 | 152.0 | 6 | 45.78% |
| 2383-bus | 1579.0 | 4 | 936.0 | 4 | 59.28% |
| 9241-bus | 4618.9 | 6 | 2639.6 | 6 | 57.15% |

As shown, the line-wise method 200 may execute up to twice as fast as the bus-wise method. In particular, for the larger power system which includes 9241-buses, the line-wise method 200 executes in 1,979 less milliseconds relative to the bus-wise method (e.g., 57.15% less time). It will be appreciated that, as the line-wise method 200 is scaled for larger power systems, the time-savings is proportionately increased. In various cases, this may accordingly allow for quicker determinations of the state of the power system, and by extension, more immediate operation of the power system. As stated previously, the faster execution times may be attributed to formulating the LWBP equations, in Equation (20), using the square of the voltage magnitudes. This provides for lower-order terms and lower-order equations, which require less intensive-computation, especially for generating the Jacobian matrix. Further, the fast execution times may be also attributed to the lack of sinusoidal terms, in Equation (20), which further simplifies the Jacobian computation.

Figure 4A:
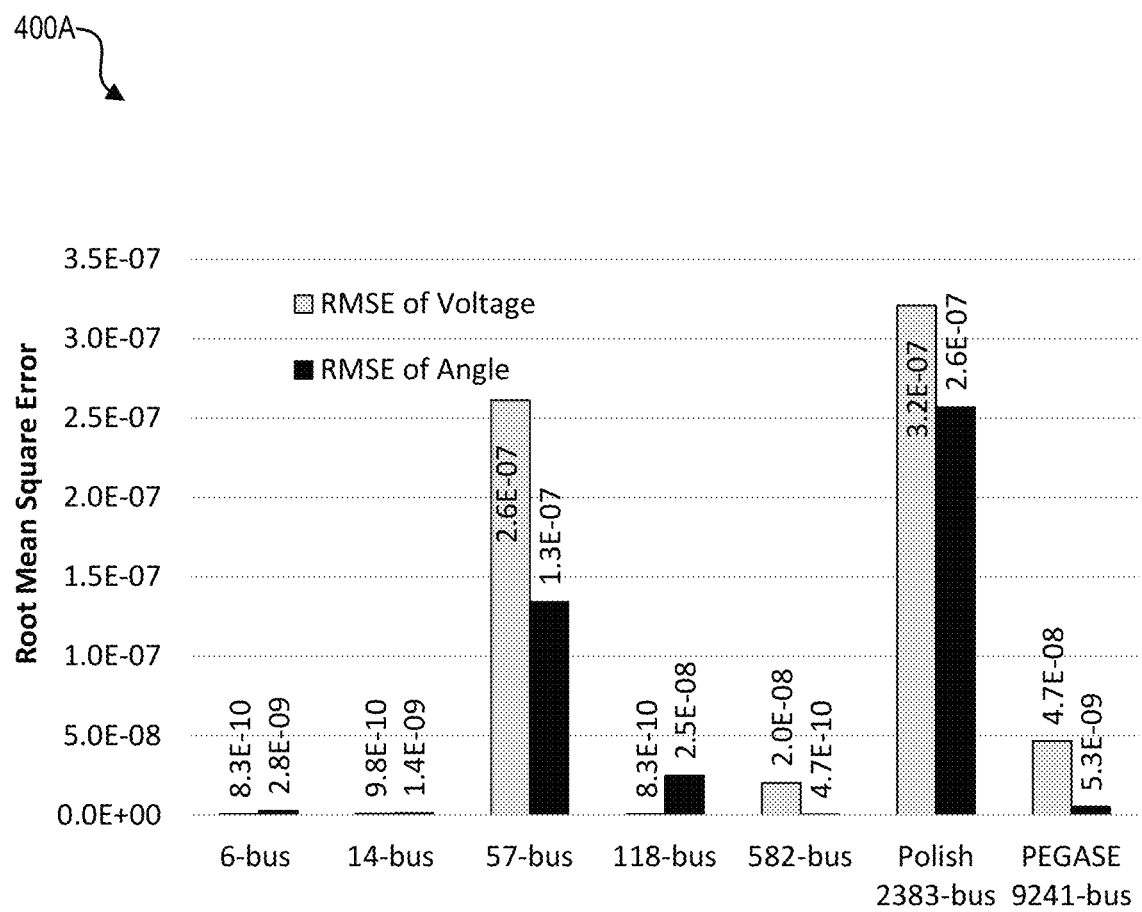
FIG. 4A is a plot comparing a solution set generated by the process of FIG. 2, as compared to a solution set generated using a conventional bus-wise power flow analysis.

Referring now to FIG. 4A, there is shown a plot 400A, which compares the bus voltage magnitude and angle solutions generated by the line-wise method 200 to those generated by a conventional bus-wise NR method. The discrepancy in solutions, as between the two methods, is quantified as a Root Mean Square Error (RMSE) values. As shown, the RMSE values are consistently low, with the largest RMSE being for the 2383-bus system, where the solutions deviate by only 3.2E-07 for the voltage magnitudes, and 2.6E-07 for the voltage angles. Accordingly, plot 400 demonstrates that the line-wise method 200 generates solutions that are at least as accurate as the bus-wise method.

Figure 4B:
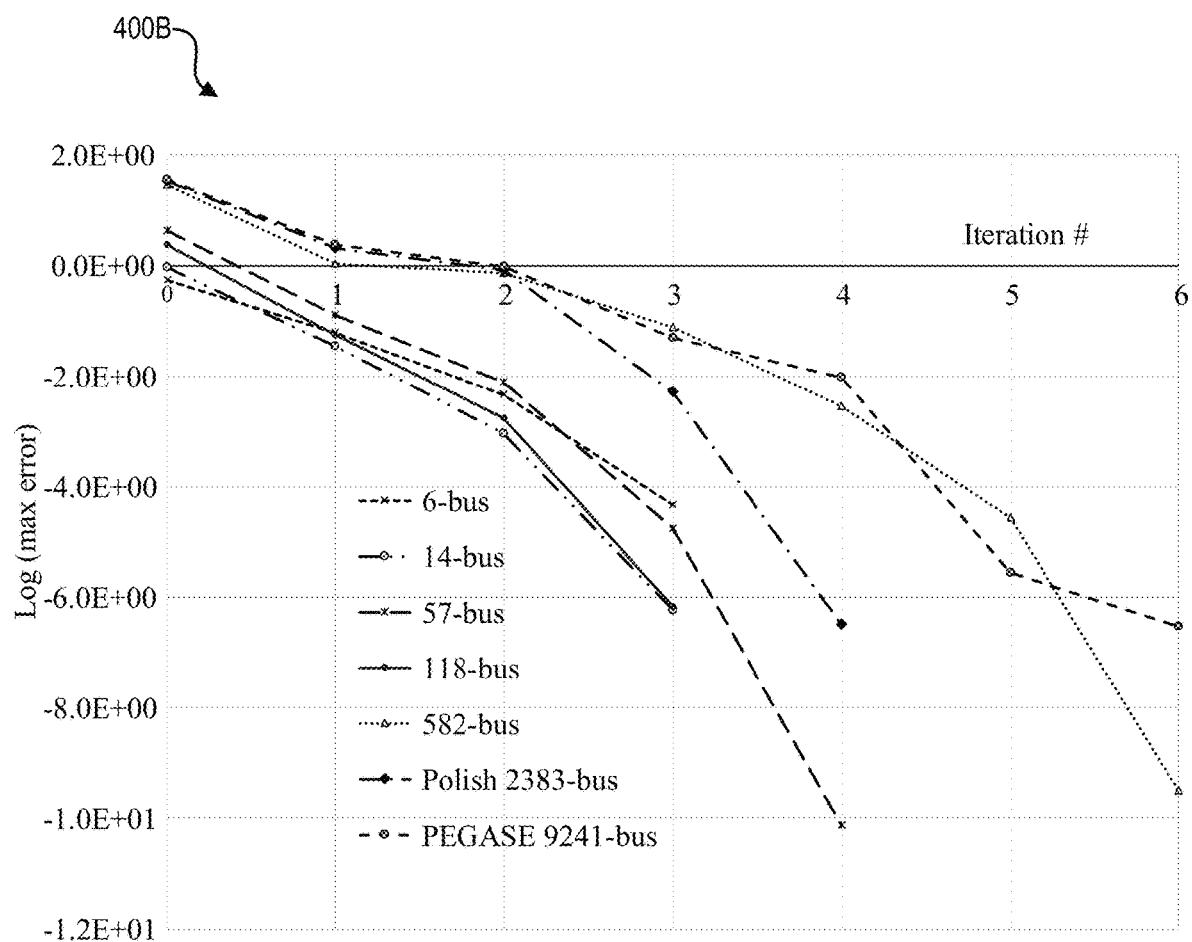
FIG. 4B is a plot comparing example convergence characteristics for the process of FIG. 2 as applied to different power systems.

Referring now to FIG. 4B, there is shown a plot 400b which compares the convergence properties of the line-wise method 200 across different power systems with varying numbers of busses. As shown, in each case, the line-wise method 200 achieves accurate solutions and demonstrates consistent monotonic convergence for each power system, as the maximum mismatch progressively reduces in each iteration in this plot.

Referring now to FIG. 4C, there is shown a table 400C which compares the equations used in the line-wise formulation of Equation (20), and the equations used in a bus-wise formulation.

As shown, the line-wise power equations are limited to including $1^{st}$ and $2^{nd}$ order terms. In contrast, the bus-wise equations include an abundance of higher-order terms (e.g., $3^{rd}$ and $4^{th}$ order terms), which increase in quantity for larger power systems. As stated previously, the line-wise equations include fewer higher-order terms because the equations are formulated according to the square of the bus voltage magnitudes ($U_a$, $U_b$), rather than the voltage magnitudes ($V_a^2$, $V_b^2$). Accordingly, this results in Equations (18) and (19) (FP(W), FQ(W)) being expressed in linear terms. In contrast, the bus-wise equations are formulated using voltage magnitudes, which may result in fourth-order terms (e.g., $V_a^4$ versus $U_a^2$). The lack of high-order terms in the line-wise formulation allows the line-wise Jacobian to be computed more quickly, and accordingly, allows for faster execution times for solving the power flow problem (see e.g., Table 3).

Table 400C also provides a comparison of the number of products in the line-wise equations including sine and/or cosine terms, as compared to the bus-wise equations. As shown, the line-wise equations generally include less products with sinusoidal terms than the bus-wise equations (e.g., only approximately 15% of the total products in the line-wise equations include sine or cosine terms). This is attributable to the fact that Equations (18) (FB(W)) and Equation (19) (FA(W)) are the only sinusoidal functions in the LWBP equations.

Referring now to FIG. 4D, there is shown table 400D which compares the number of fourth-order, cubic, and quadratic terms in the line-wise Jacobian matrices, as compared to the bus-wise Jacobian matrices. Table 400D also compares the number of linear terms and the number of products in the line-wise and bus-wise Jacobian matrices. As shown, the line-wise Jacobian matrices consistently include a larger number of linear terms, fewer high order terms (e.g., fourth-order, and cubic), and fewer product computations, as compared to the bus-wise Jacobian matrices. In particular, and on average, the line-wise Jacobian matrices includes 1.5 times less product computations than the bus-wise Jacobians. The abundance of linear and low-order terms, and the lack of non-linear and higher-order terms, allows the line-wise Jacobians to be computed more quickly than the bus-wise Jacobians. This reduces the execution time for the line-wise power flow analysis.

Referring now to FIG. 4E, there is shown table 400E, which compares the size, condition, and sparsity factors for the line-wise Jacobian matrices as compared to the bus-wise Jacobian matrices. As shown, while the line-wise Jacobian matrices may be larger in size, this is mitigated by the line-wise Jacobians exhibiting better conditioning and better sparsity factors. For example, If the condition number is very large, then the matrix is said to be ill-conditioned so it is desired that the condition number be small, which is possible using the teachings herein. In particular, for large power systems (e.g., 9,241 busses), the line-wise Jacobian has a 99.99 sparsity factor, which allows the Jacobian to be computed relatively quickly while occupying minimal memory storage space on an executing processing system (e.g., memory 918b in FIG. 9B). In various cases, the reduced memory usage also allows for faster computation of the Jacobian.

In various some embodiments, based on the Jacobian matrix generated at act 208 of method 200, it may be determined which transmission lines, or set of transmission lines, in the power system is most susceptible to voltage collapse (e.g., at act 214 of method 200).

In particular, it has been appreciated that the elements of Jacobian sub-matrices, corresponding to the partial-differentials $$\left[\frac{\partial FF_l}{\partial U_a}\right], \text{ and } \left[\frac{\partial FS_l}{\partial U_a}\right]$$

corresponding to the "l-th" transmission line, reduce to substantially zero (or proximate to zero) when the "l-th" transmission line is susceptible to voltage collapse.

The sub-matrix $$\left[\frac{\partial FF_l}{\partial U_a}\right]$$

is a partial-differential of the line-based voltage function for the "first end" of the "l-th" transmission branch with respect to the square of the voltage magnitude at a first bus of the transmission branch (e.g., bus 102 in FIG. 1). Conversely, sub-matrix $$\left[\frac{\partial FS_l}{\partial U_a}\right]$$

is a partial-differential of the line-based voltage function for the "second end" of the "l-th" transmission branch with respect to the square of the voltage magnitude at a second bus of the transmission branch (e.g., bus 104 in FIG. 1). Accordingly, a first voltage collapse index ($VCI_a$) may be formulated using the sub-matrix $$\left[\frac{\partial FF_l}{\partial U_a}\right]$$

to detect voltage collapse in the first end of a transmission branch, and a second voltage collapse index ($VCI_b$) may be formulated using the second sub-matrix $$\left[\frac{\partial FS_l}{\partial U_b}\right]$$

to determine voltage collapse in the second end of a transmission branch, wherein each of the first and second VCIs may be expressed in accordance with Equations (24) and (25).

$$VCI_a = \frac{\partial FF_l}{\partial U_a} = 2 \cdot U_a + 2 \cdot \left(PF_l \cdot R_l + QF_l \cdot X_l - \frac{U_b}{2}\right) \quad (24)$$

$$VCI_b = \frac{\partial FS_l}{\partial U_b} = 2 \cdot U_b + 2 \cdot \left(PS_l \cdot R_l + QS_l \cdot X_l - \frac{U_a}{2}\right) \quad (25)$$

In particular, it is has been appreciated that Equations (24) and (25) yield voltage collapse indices as a result of information available from Equations (10) and (17), respectively ($FS_l$, $FF_l$). Equations (10) and (17) are quadratic equations, which can be solved for the square of the bus voltages ($U_a$, $U_b$) according to Equations (26) and (27), respectively:

$$U_b = -\left(PS_l \cdot R_l + QS_l \cdot X_l - \frac{U_a}{2}\right) \pm \quad (26)$$
$$\sqrt{\left(PS_l \cdot R_l + QS_l \cdot X_l - \frac{U_a}{2}\right)^2 - SS_l^2 \cdot Z_l^2}$$

$$U_a = -\left(PF_l \cdot R_l + QF_l \cdot X_l - \frac{U_b}{2}\right) \pm \quad (27)$$
$$\sqrt{\left(PF_l \cdot R_l + QF_l \cdot X_l - \frac{U_b}{2}\right)^2 - SF_l^2 \cdot Z_l^2}$$

In normal power system operations, each of Equations (26) and (27) resolves into two solutions for the square of the bus voltage ($U_a$, $U_b$), e.g., one solution which is physically feasible (e.g., a higher voltage solution), and one solution which is physical infeasible (e.g., a lower voltage solution). At voltage collapse—i.e., as the power system is loaded—the two voltage solutions for each of Equations (26) and (27) converge until each Equation resolves into one solution, rather than two solutions. Accordingly, the term located inside of the square root portion effectively reduces to zero to yield one solution, and Equations (26) and (27) may be re-written and re-arranged according to Equations (28) and (29), respectively:

$$U_b + \left(PS_l \cdot R_l + QS_l \cdot X_l - \frac{U_a}{2}\right) = 0 \quad (28)$$

$$U_a + \left(PF_l \cdot R_l + QF_l \cdot X_l - \frac{U_b}{2}\right) = 0 \quad (29)$$

The terms in Equations (28) and (29) are located identically within Equations (24) and (25). Accordingly, at voltage collapse, the two sub-differentials in Equations (24) and (25) reduce to substantially zero, as shown in Equations (28) and (29). It should be noted that since VCI values are not similar for all power systems and their behavior is nonlinear, their proximity to zero is monitored to determine if there is a Voltage Collapse.

In view of the foregoing, the line-wise power flow method allows voltage collapse to be determined, at both ends of a transmission line (e.g., $VCI_a$, $VCI_b$), directly from the Jacobian matrix via the first and second VCIs. In contrast, the Jacobian generated by the bus-wise NR method requires additional computation to resolve the transmission lines susceptible to voltage collapse. The additional computation accordingly requires additional and delayed computation time.

Figure 5A:
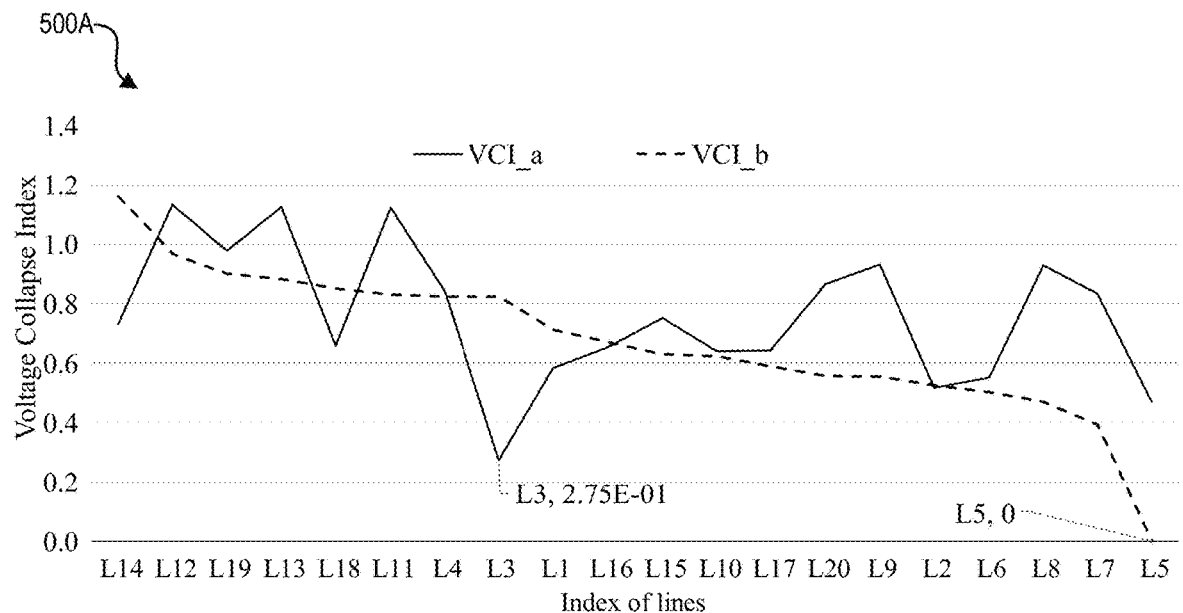
FIG. 5A is a plot showing the voltage collapse indices for an example 14-bus power system with 20 transmission lines.

Referring now to FIG. 5A, there is shown a plot 500A which plots the voltage collapse indices ($VCI_a$, $VCI_b$) for an example 14-bus IEEE power system which includes 20 transmission lines. In this example case, the bus loads in the power system are scaled by 3.83 times in order to simulate higher loading conditions to induce voltage collapse. The indices, used in the plot 500A, are extracted directly from the line-wise Jacobian matrix generated for that system. As shown, in this example case, the fifth line (L5) is most susceptible to voltage collapse because the second voltage collapse index ($VCI_b$) is zero, and its first voltage collapse index is ($VCI_a$) is significantly low (e.g., 4.70E-01).

Figure 5B:
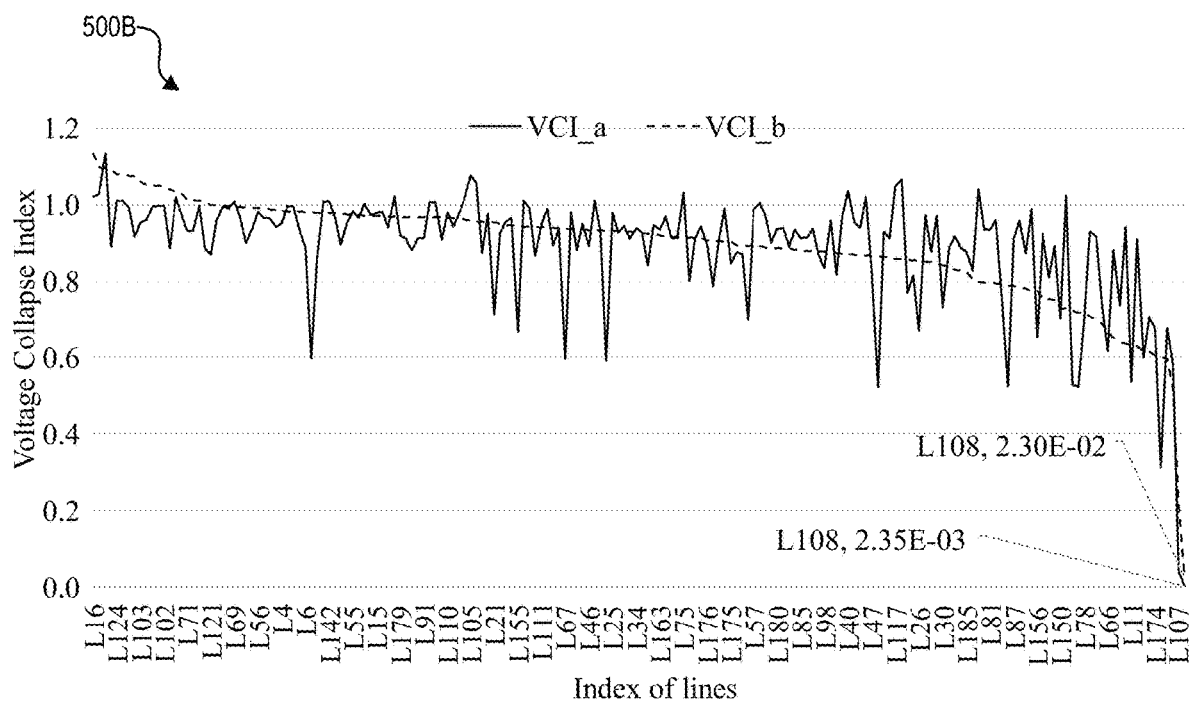
FIG. 5B is a plot showing the voltage collapse indices for an example 118-bus power system with 186 transmission lines.

Referring now to FIG. 5B, there is shown a plot 500B which plots the voltage collapse indices ($VCI_a$, $VCI_b$) for an example 118-bus IEEE system which includes 186 transmission lines. In this example case, the bus loads are scaled by 4.23 times to induce voltage collapse. As shown, transmission line 108 (L108) is most susceptible to voltage collapse as the first voltage collapse index ($VCI_a$) is equal to 2.35E-03, and the second voltage collapse ($VCI_b$) index is equal to 2.30E-02 (i.e., substantially zero).

Figure 5C:
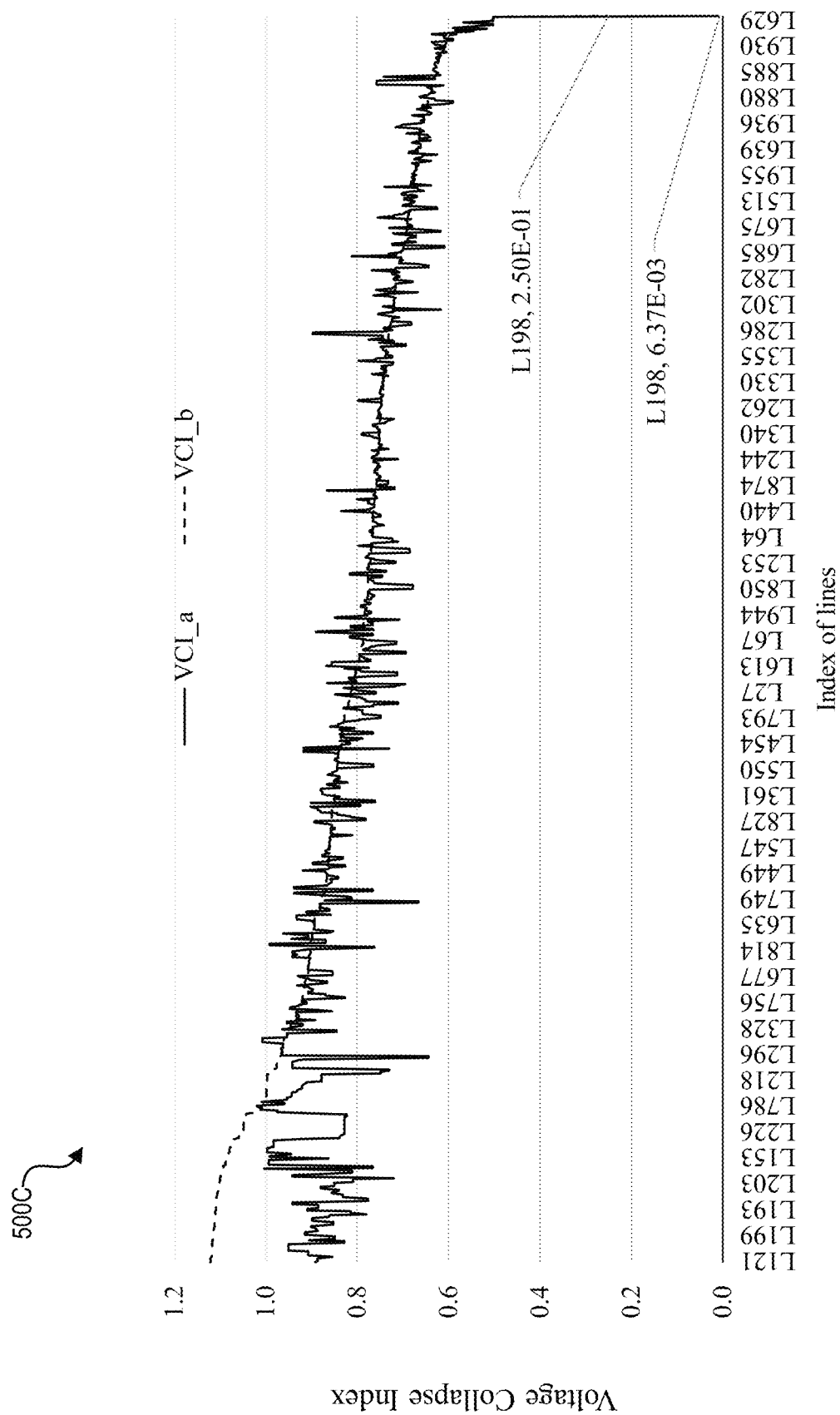
FIG. 5C is a plot showing the voltage collapse indices for an example 583-bus power system with 965 transmission lines.

Referring now to FIG. 5C, there is shown a plot 500C which plots the voltage collapse indices ($VCI_a$, $VCI_b$) for an example 582-bus real power system which includes 965 transmission lines. In this example case, the bus loads are scaled by 2.253 times to induce voltage collapse. As shown, transmission line 109 (L109) is most susceptible to voltage collapse as the first voltage collapse index ($VCI_a$) is equal to 6.37E-03, and the second voltage collapse ($VCI_b$) index is equal to 2.53E-01.

Table 4, below, shows example worst-case voltage collapse indices for a 14-bus, 118-bus, and 582-bus system, and the computation-time required to determine these indices using a bus-wise NR method versus a line-wise NR method.

TABLE 4

Determining voltage collapse indices using bus-wise method versus line-wise method

| | | Worst VCI (minimum VCI at both sides) | | | Computation time (milliseconds) | |
|---|---|---|---|---|---|---|
| | | Bus-wise NR method | Line-wise NR method | Difference | Bus-wise NR method | Line-wise NR method |
| 14-bus | $VCI_a$ | 0.277 | 0.274 | 0.003 | 13.0 | 4.0 |
| | $VCI_b$ | 0.0 | 0.0 | 0.0 | | |
| 118-bus | $VCI_a$ | 0.00195 | 0.00235 | 0.0004 | 39.0 | 15.0 |
| | $VCI_b$ | 0.029 | 0.023 | 0.006 | | |
| 582-bus | $VCI_a$ | 0.006 | 0.0064 | 0.0004 | 421.0 | 152.0 |
| | $VCI_b$ | 0.2512 | 0.2499 | 0.0013 | | |

As shown, the bus-wise and line-wise methods determine nearly the same values for the VCIs, which at least demonstrates the solution accuracy for the line-wise method. The line-wise method, however, determines these indices in less computational time. On average, the line-wise method resolves the VCIs as fast, or up to twice as fast, as the bus-wise method. The faster computation time, for the line-wise method, results because the VCIs are directly extracted from the line-wise Jacobian matrix. In contrast, additional computation is required to determine the VCIs from the bus-wise Jacobian. The faster computation, under the line-wise method, may accordingly allow quicker determinations of the critical lines in a power system, and by extension, allow for more immediate corrective action.

In at least some cases, the VCIs derived from line-wise Jacobian may be used for performing an N–1 contingency analysis. In a power system having "N" elements (e.g., transmission branches, cables, etc.) the contingency analysis performs a power flow analysis for "N" cases where each one of the "N" elements uniquely fails separately. The objective is to determine whether the remaining "N–1" elements in the power system allow the power system to function properly, and to supply power to all of the loads, for each of the "N" voltage collapse cases. The contingency analysis may be performed by first generating a ranking of the transmission lines in order of voltage collapse susceptibility. Subsequently, based on the ranking, a separate power flow analysis is conducted for each transmission line (e.g., starting from the transmission line most susceptible to voltage collapse) to determine the effect of that transmission line collapsing. It will be appreciated that for a power network that includes thousands of elements, thousands of contingency analysis are required to be completed. As such, using a line-wise power flow analysis that quickly and immediately resolves the VCI indices, may allow for significant time savings. Table 5, below, demonstrates the computation time to generate a voltage stability contingency analysis using a line-wise NR method versus a bus-wise NR method. Table 5 demonstrates that the line-wise NR method is able to generate the contingency ranking in as fast, or twice as fast, as the conventional bus-wise NR method.

TABLE 5

Comparison of computation time for voltage stability contingency analysis for line-wise method versus bus-wise method

| System | Number of contingency cases (number of lines) | Traditional bus-wide NR method (seconds) | Proposed Line-wide NR method (seconds) | Computation time of line-wise method as percentage of bus-wise method |
|---|---|---|---|---|
| 14-bus | 20 | 0.26 | 0.08 | 30.77% |
| 57-bus | 80 | 2.24 | 0.988 | 44.11% |
| 118-bus | 186 | 7.254 | 4.185 | 57.69% |
| 300-bus | 411 | 49.32 | 22.194 | 45.00% |
| 2383-bus | 2896 | 6081.8 | 2710.7 | 44.57% |

Referring now to FIG. 5D, there is shown table 500D, which shows an example contingency analysis for a 2835-bus Polish system using a bus-wise NR method, as compared to a line-wise NR method. The table 500D shows the twenty lines that are the most susceptible to voltage collapse, out of the 2896 lines assessed as shown in Table 5. As shown, each method generates the same contingency analysis ranking and analysis, however, the line-wise NR method generates the ranking in as equal, or less, amount of execution time as the bus-wise NR method.

In various cases, where the contingency analysis determines a VCI value is critical, at least one of a number of corrective actions may be taken, including: (a) re-optimizing the distribution of power across transmission branches (e.g., solving an OPF problem as explained herein); (b) shedding load busses in the power system; (c) increasing the power generation for power generators in the power system, or otherwise, activating new power generators; and (d) re-inserting off-line elements (such as transformers, transmission lines, cables, generators, etc.) in the power system.

In at least one example application, the set of line-wise power balance equations may be used as equality constraints in an optimal power flow (OPF) formulation for solving an optimal power flow (OP F) problem.

The objective of an OPF problem is to minimize an objective function in relation to a power system. In at least some embodiments, the objective function is a total power generation cost function ($f_o(W')$) for the power system which is approximated as a second-order cost function, according to Equation (30):

$$f_o(W') = \Sum_{g=1}^{NG} c1_g + c2_g \cdot PG_g + c3_g \cdot PG_g^2 \quad (30)$$

where NG is a total number of power generators in the power system, g is the $g^{th}$ power generator, $PG_g$ is the active power generation of the $g^{th}$ power generator, $c1_g$ is a first constant for the $g^{th}$ power generator, $c2_g$ is a second constant for the $g^{th}$ power generator, and $c3_g$ is a third constant for the $g^{th}$ power generator. Further, $W'$ is a modified problem vector.

In other embodiments, the objective function may be any other non-linear continuously differential objective function, depending on the minimization problem being studied. For example, rather than being an actual financial cost or it may be another parameter such as input power that is to be minimized depending on the constants which are selected for the function. These include real power loss minimization, determination of minimum amount of capacitors for a power system to ensure satisfactory voltage profile, etc.

The following example, shown in Table 6, pertains to Ontario, Canada. The Ontario electric power system has 5.6 million customers with a peak demand of 25 GW. The method provides a 2% reduction of by finding a better optimal solution. Considering a 2% improvement in the optimal solution determined by OPF every hour of the year, for 8760 hours, the cost savings will equal: $333,274,873.36 for the 5.6 million customers.

TABLE 6

Savings using LWOPF formulation for Example Power System in Ontario, Canada

| Item | Amount |
| --- | --- |
| Power & Distribution Revenues ($) | $16,663,743,668.00[1] |
| Total Electricity Generated and Delivered to Customers (kWh) | 126,378,180,878[1] |
| Amount Per Year for a 2% Saving | $333,274,873.36 (e.g., 2% of $16,663,743,668.00) |
| Amount Per Hour for a 2% Saving | $38,045.08 (e.g., 1/8760$^{th}$ of $333.274,873.36) |

[1] Data from page #3 of the 2017 Yearbook of Electricity Distributors. Please refer to the file PDF: 2017_Yearbook_of_Electricity_Distributors.

In the optimal power flow problem, the minimization of the objective $f_o(W')$ is subject to a set of equality constraints, expressed by Equation 31), and a set of inequality constraints, expressed by Equation (32):

$$f_g(W') = d \quad (31)$$

$$\underline{h} \leq f_h(W') \leq \overline{h} \quad (32)$$

where $f_g(W')$ is the set of equality constraints, d is a target vector for the equality constraints, $f_h(W')$ is a set of inequality constraints, and $\underline{h}$ and $\overline{h}$ are the upper and lower bounds of the inequality constraints, respectively.

In accordance with the teachings provided herein, a line-wise optimal power flow formulation (LWOPF) is provided for solving the OPF problem, wherein the equality constraint $f_g(W')$ is defined by the set of LWPB equations FT(W) developed in Equation (20), with the exception that Equations (18) and (19) are re-arranged according to Equations (33) and (34), respectively.

$$FP_l = PG + [M] \begin{bmatrix} PF \\ PS \end{bmatrix} - U \cdot GS = PD \quad (33)$$

$$FQ_l = QG + [M] \begin{bmatrix} QF \\ QS \end{bmatrix} + U \cdot BS = QD \quad (34)$$

The problem vector W is accordingly modified to generate a modified problem vector $W' = [U\ \delta\ PF\ PS\ QF\ QS\ PG\ QG]^T$. Similarly, the target vector ST is modified to generate a modified target vector d, wherein $d = [0\ 0\ 0\ 0\ PD\ QD]^T$.

In at least some embodiments, the modified problem vector (W') may be divided into two components: a control vector (WC), and a dependent vector (WD), wherein the control vector $WC = [U\ PG]^T$, and the dependent vector $WD = [\delta\ PF\ PS\ QF\ QS\ QG]^T$.

By contrast, Equation (32) represents the set of inequality constraints for solving the optimal power flow problem. Equation (32) expresses the various system limits for the bus voltages, the generator outputs, and the limits on the MVA line power flow in the power system. In various embodiments, the inequality constraints in Equation (32) are expressed according to Equations (35)-(39):

$$\underline{U_i} \leq U_i \leq \overline{U_i} (\forall i \in NB) \quad (35)$$

$$\underline{PG_g} \leq PG_g \leq \overline{PG_g} (\forall g \in NB) \quad (36)$$

$$\underline{QG_g} \leq QG_g \leq \overline{QG_g} (\forall g \in NG) \quad (37)$$

$$PF_l^2 + QF_l^2 \leq (\overline{SL_{l(A)}})^2 (\forall l \in NT) \quad (38)$$

$$PS_l^2 + QS_l^2 \leq (\overline{SL_{l(B)}})^2 (\forall l \in NT) \quad (39)$$

where Equation (35) expresses the upper and lower limits for the square of the bus voltage ($U_i$) at the i-th index bus, as applied to all busses in the power system (NB); Equation (36) expresses the limits for the active power generation ($PG_g$) at the g-th power generator, as applied for all power generators in the power system (NG); Equation (37) expresses the limits for the reactive power generation ($PG_g$) at the g-th power generator, as applied for all power generators (NG); and Equations (38) and (39) express the limits on the active and reactive MVA line power flow ($\overline{SL_l}$), respectively, at the l-th transmission line, as applied for all transmission lines (NT).

Accordingly, the upper and lower limits for the inequality constraints in Equation (32) are defined according to Equations (40) and (41).

$$\underline{h} = [\underline{U}\,\underline{PG}\,\underline{QG}\,0\,0] \quad (40)$$

$$\overline{h} = [\overline{U}\,\overline{PG}\,\overline{QG}\,(\overline{SL_{l(A)}})^2\,(\overline{SL_{l(B)}})^2] \quad (41)$$

Using the equality and inequality constraints, the objective function is then minimized using an LWOPF method. In various cases, the LWOPF method is solved using a successive linear programming (SLP) algorithm, which involves: (a) solving the set of line-wise power balance equations (e.g., $f_g(W')$) to resolve the current state of the power system, (b) solving a linear incremental OPF model to determine an optimal incremental change to the control vector (WC); and (c) updating the control vector using the determined optimal incremental change. The SLP algorithm is iterated until the control vector (WC) minimizes the objective function (i.e., the cost generation function or another function as the case may be). While an SLP algorithm is provided herein for solving the OPF problem, it will be appreciated that any other appropriate iterative or non-iterative algorithm may be alternatively used.

Figure 6:
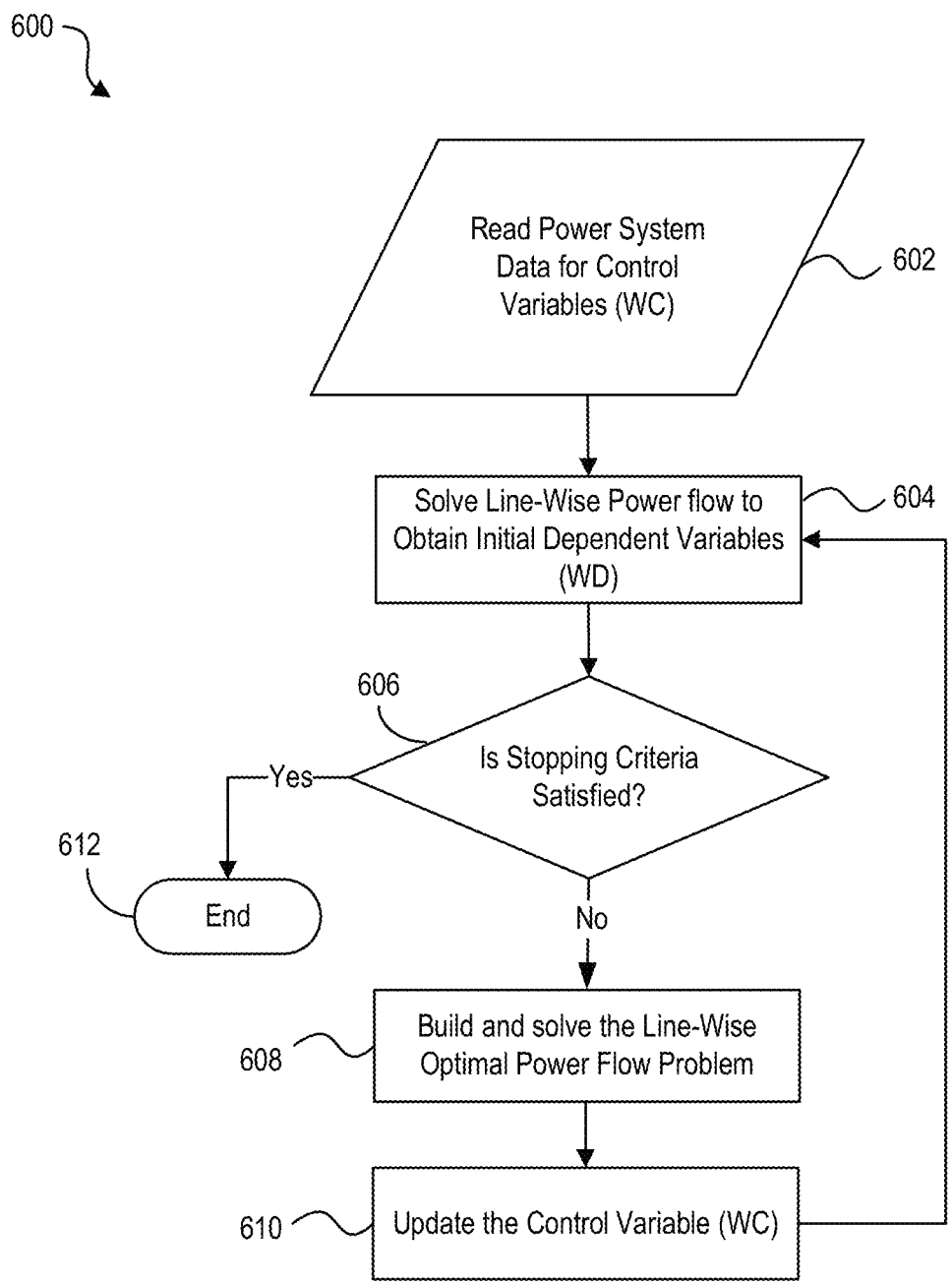
FIG. 6 is an example process flow diagram for a process for solving a line-wise optimal power flow (LWOPF) problem using a successive linear programming (SLP) algorithm.

Referring now to FIG. 6, there is shown a process flow for an example embodiment of a method 600 for solving the line-wise optimal power flow problem (LWOPF) using a successive linear programming (SLP) algorithm. In various cases, the method 600 may be implemented by the OPF solver sub-center 912 of FIG. 9A.

At act 602, power system data is read to determine the current state for the control variables (WC). For example, the current power system data may be retrieved from data provided by one or more sensors 904a-904e of FIG. 9A, as processed via the SCADA sub-center 908 and the State Estimator sub-center 910 of FIG. 9A.

At act 604, the set of line-wise power flow equations (e.g., $f_g(W')$) is solved to determine the dependent variables (WD). In various cases, act 604 requires implementing the method 200 of FIG. 2 using the modified line-wise power flow equations ($f_g(W')$) in Equation (31).

At act 606, it is determined whether the stopping criteria has been satisfied. In at least some embodiments, determining whether the stopping criteria is satisfied includes determining whether: (a) a pre-defined maximum number of iterations, of method 600, is exceeded; (b) the equality constraint of Equation (31) is satisfied; (c) the inequality constraint of Equation (32) is satisfied; and/or (d) the stopping condition, expressed in Equation (42), is satisfied:

$$\frac{|f_o(W'^k) - f_o(W^{k-1})|}{\|f_o(W^k)\|} \le \gamma \tag{42}$$

where $f_o(W'^k)$ is the solution to the objective function using the values in the problem vector (W') resolved in the current iteration (k) of method 600, and $f_o(W'^{k-1})$ is the solution to the objective function using the values in the problem vector (W') resolved in the previous iteration (k−1) of method 600. Further, γ is a predefined mismatch tolerance.

In at least some embodiments, the stopping criteria is determined by first considering whether the equality and inequality constraints of Equations (31) and (32) are satisfied. If the constraints are satisfied, it is then determined whether the stopping condition of Equation (42) is satisfied. In other embodiments, the stopping criteria is satisfied based only on whether the pre-defined maximum number of iterations for method 600 is exceeded.

Where the stopping criteria at act 606 is satisfied, at act 612, the method 600 is determined to be complete, and the control vector (WC) is determined to minimize the objective function ($f_o(W')$). Otherwise, where the stopping criteria at act 606 is not satisfied, the method 600 continues to act 608.

At act 608, the objective function and set of equality and inequality constraints are linearized and solved for an optimal incremental change to the problem vector (ΔW'). In various embodiments, the optimal incremental change to the problem vector ΔW' is defined as ΔW'=[ΔU Δδ ΔPF ΔPS ΔQF ΔQS ΔPG ΔQG]$^T$.

In at least some embodiments, the objective function is linearized by approximating the objective function using a first-order Taylor's series expansion, in accordance with Equations (43) and (44).

$$\min \Delta f_o(W) = \left[\frac{df_o(W)}{dW}\right] \cdot \Delta W \tag{43}$$

$$\min \Delta f_o(\Delta W) = \sum_{g=1}^{NG} [(c2_g + 2 \cdot c3g \cdot PG_g) \cdot \Delta PG_g] \tag{44}$$

The linearized set of equality constraints may be similarly expressed in accordance with Equation (45), which may be rearranged to solve for the optimal incremental change to the problem vector (ΔW'):

$$\Delta f_g(W') = [J\ D]\Delta W' = \Delta d \tag{45}$$

where J is the Jacobian of the set of line-wise power balance equations, as shown in 300A of FIG. 3, and D is a submatrix of partial differential equations in respect of the real power generation (PG) and the reactive power generation (QG), which are not included in the original problem vector (W). The sub-matrix D is expressed according to Equation (46).

$$D = \begin{bmatrix} \frac{\partial FF}{\partial PG} & \frac{\partial FS}{\partial PG} & \frac{\partial FA}{\partial PG} & \frac{\partial FP}{\partial PG} & \frac{\partial FQ}{\partial PG} \\ \frac{\partial FF}{\partial QG} & \frac{\partial FS}{\partial QG} & \frac{\partial FA}{\partial QG} & \frac{\partial FP}{\partial QG} & \frac{\partial FQ}{\partial QG} \end{bmatrix}^T \tag{46}$$

The vector Δd is further defined as Δd=[0 0 0 0 0 0]$^T$.

The linearized set of inequality constraints may be similarly expressed in accordance with Equations (47)-(51):

$$\underline{\Delta U_i} \le \Delta U_i \le \overline{\Delta U_i} (\forall i \forall NB) \tag{47}$$

wherein $\underline{\Delta U_i} = \alpha \cdot (\underline{U_i} - U_i^o)$ and $\overline{\Delta U_i} = \alpha \cdot (\overline{U_i} - U_i^o)$ $$\underline{\Delta PG_g} \le \Delta PG_g \le \overline{\Delta PG_g} (\forall g \in NB) \tag{48}$$

wherein $\underline{\Delta PG_g} = \alpha \cdot (\underline{PG_g} - PG_g^o)$ and $\overline{\Delta PG_g} = \alpha \cdot (\overline{PG_g} - PG_g^o)$ $$\underline{\Delta QG_g} \le \Delta QG_g \le \overline{\Delta QG_g} (\forall g \in NG) \tag{49}$$

wherein $\underline{\Delta QG_g} = \alpha \cdot (\underline{QG_g} - QG_g^o)$ and $\overline{\Delta QG_g} = \alpha \cdot (\overline{QG_g} - QG_g^o)$ $$2 \cdot PF_l \cdot \Delta PF_l + 2 \cdot QF_l \cdot \Delta QF_l \le \overline{\Delta SL_l} (\forall l \in NT) \tag{50}$$

$$2 \cdot PS_l \cdot \Delta PS_l + 2 \cdot QS_l \cdot \Delta QS_l \le \overline{\Delta SL_l} (\forall l \in NT) \tag{51}$$

wherein $\overline{\Delta SL_l} = \alpha \cdot (\overline{SL_l} - SL_l^o)$ where α is a pre-defined incremental step-size, and $U_i^o$, $PG_g^o$, $QG_g^o$, $SL_l^o$ are the values located in the modified problem vector (W') resolved in act 604.

Accordingly, Equations (44)-(51) define the linearized optimization formulation for the LWOPF problem. Using the values derived in act 604 for the problem vector (W'), the linearized optimization formulation may be solved for the optimal incremental change to the problem vector (ΔW') in Equation (45). In various cases, the linearized optimization formulation may be solved using any appropriate linear optimization method (e.g., simplex, or interior point algorithm).

At 610, the problem vector (W') is updated based on the incremental change to the problem vector (ΔW') determined at act 608, in accordance with Equation (52):

$$W'^{(k)} = W'^{(k-1)} + \Delta W'^{(k)} \tag{52}$$

where $W'^{(k)}$ is the updated problem vector, $W'^{(k-1)}$ is the problem vector generated in the previous iteration (k−1) of method 600, and $\Delta W'^{(k)}$ is the incremental change to the problem vector, as determined at act 608.

Based on Equation (52), an updated control vector (WC) is extracted from the updated problem vector ($W'^{(k)}$), and the method 600 may return to act 604 to proceed with the next iteration. The method 600 iterates until the stopping criteria at act 606 is satisfied.

Table 7, below, compares the execution time and number of iterations, required to minimize the objective function using the line-wise method 600, as compared to a bus-wise optimal power flow method. The comparison is shown for three different OPF solvers implementing both the method 600, and the bus-wise OPF method.

TABLE 7

Comparison of LWOPF method and a conventional bus-wise OPF method

| | First OPF Solver | | | Second OPF Solver | | | Third OPF Solver | | |
| --- | --- | --- | --- | --- | --- | --- | --- | --- | --- |
| System | Time ratio (%) | Iter # | Objective function ratio (%) | Time ratio (%) | Iter # | Objective function ratio (%) | Time ratio (%) | Iter # | Objective function ratio (%) |
| 6-bus | 40.6 | 2 | 98.56 | 47.8 | 2 | 99.99 | 53.6 | 2 | 98.56 |
| 14-bus | 58.8 | 2 | 98.64 | 70.0 | 2 | 99.98 | 82.5 | 2 | 99.89 |
| 30-bus | 49.0 | 2 | 98.30 | 49.0 | 2 | 99.84 | 52.0 | 2 | 99.62 |
| 57-bus | 84.8 | 3 | 99.72 | 133.3 | 3 | 100.00 | 187.9 | 3 | 100.0 |
| 118-bus | 42.5 | 4 | 97.58 | 45.7 | 4 | 99.81 | 53.3 | 4 | 97.14 |
| 300-bus | 76.1 | 3 | 95.90 | 94.0 | 3 | 98.05 | 98.3 | 3 | 98.12 |
| 582-bus | 82.1 | 4 | 97.77 | 85.3 | 4 | 100.00 | 85.3 | 4 | 97.95 |
| 2383-bus | 56.4 | 3 | 99.46 | 65.1 | 3 | 99.98 | 65.1 | 3 | 99.48 |
| 9241-bus | 62.3 | 6 | 97.52 | 111.5 | 6 | 99.84 | 154.5 | 6 | 99.86 |

As shown, for various systems with different numbers of buses, the LWOPF method 600 is, on average, nearly twice as fast as the conventional bus-wise OPF method as observed from the "Time Ratio (%)" column. Further, the solution to the objective function, as between the two methods, is nearly identical as observed from the "Objective function ratio (%)" column, which at least demonstrates the accuracy of the LWOPF method 600. As explained previously, the faster execution times for the LWOPF are attributed to the use of the square bus voltage magnitudes (U), rather than the voltage magnitudes ($V^2$). This fact results in the line-wise equations being expressed with lower order terms (see e.g., Equations (33) and (34)). Further, the line-wise formulation also includes lesser sinusoidal components. Accordingly, this simplifies the calculation of the Jacobian matrix during acts 604 and 608 of method 600, and decreases the computation and execution time of the LWOPF method 600.

Figure 7:
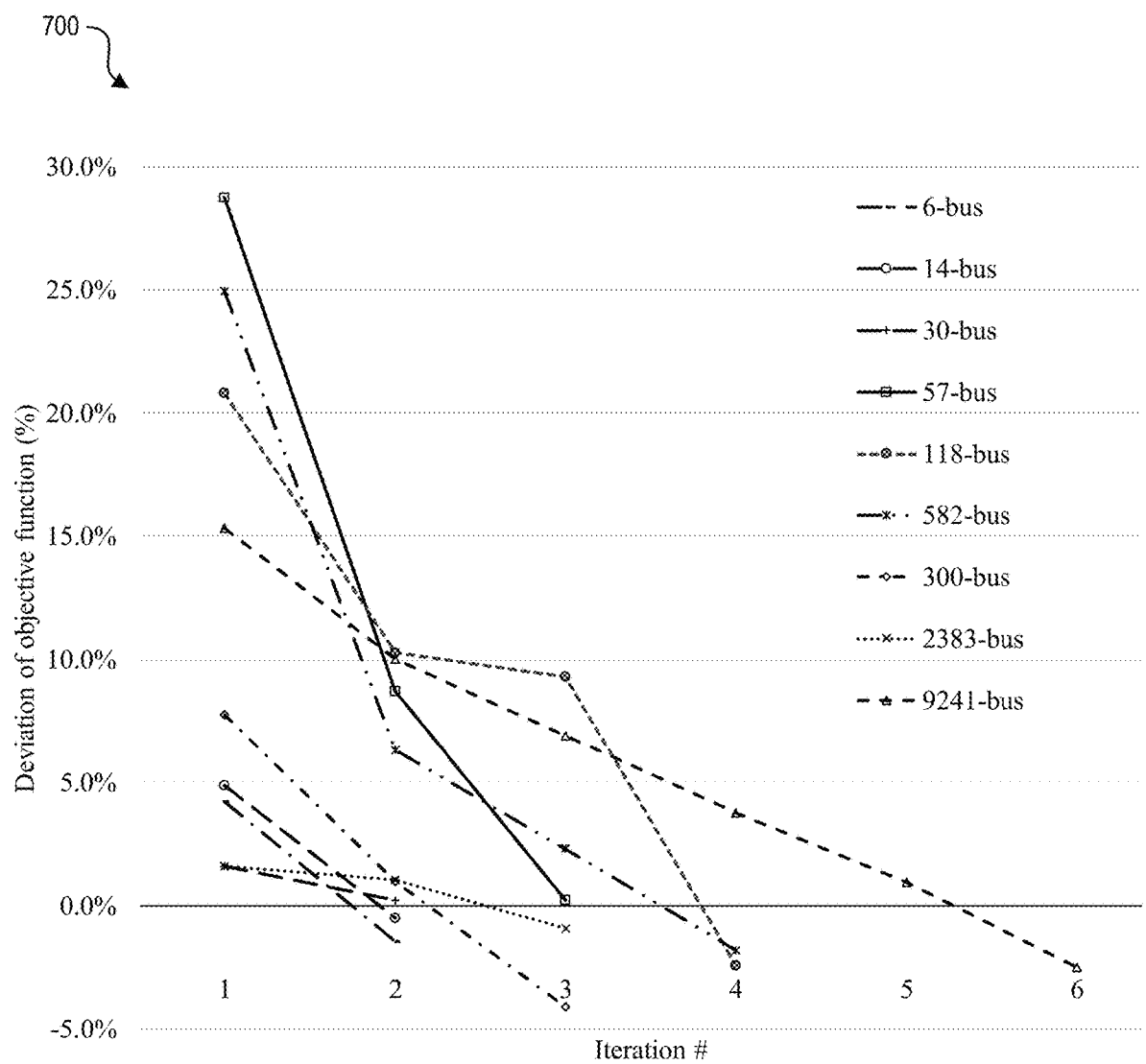
FIG. 7 is a plot comparing solutions for an objective function generated using the process of FIG. 6, as compared to solutions generated using a bus-wise optimal power flow formulation.

Referring now briefly to FIG. 7, there is shown a plot 700 which compares the solution to the objective function using the LWOPF method 600 versus a solution generated using a leading commercial bus-wise OPF solver. In particular, the Y-axis expresses the deviation to the solution of the objective function as between the two methods, expressed as a percentage of the best-known value generated by the leading commercial bus-wise OPF solver. The plot 700 assumes a mismatch tolerance (γ) of $10^{-6}$. As shown, the LWOPF method 600 provides monotonic convergence, as the deviation of the objective function from the best-known bus-wise solution reduces progressively, and at up to twice the speed of the leading commercial bus-wise OPF solver.

Table 8, below, provides a comparison between the solution to the OPF problem using the line-wise set of equations, in accordance with method 600, as compared to solving the OPF problem using a set of bus-wise equations. Table 8 assumes the objective function is a total power generation cost function, as expressed in Equation (30).

TABLE 8

Comparison of cost generation and execution time between LWOPF method and bus-wise method solved using SLP

| | | Objective: Generation Cost ($) | | Execution Time (seconds) | | | | Objective function ratio | Ratio of execution times |
| --- | --- | --- | --- | --- | --- | --- | --- | --- | --- |
| System | No. of Busses | SLP Based BWOPF | SLP Based LWOPF | SLP Based BWOPF | Iter # | SLP Based LWOPF | Iter # | LWOPF as % of BWOPF | LWOPF as % of BWOPF |
| 6-bus | 6 | 3,142.0 | 3,094.7 | 0.069 | 2 | 0.028 | 2 | 98.49 | 40.58 |
| 14-bus | 14 | 5,198.9 | 5,120.5 | 0.08 | 2 | 0.047 | 2 | 98.64 | 58.75 |
| 30-bus | 30 | 583.3 | 573.4 | 0.1 | 4 | 0.049 | 2 | 98.30 | 49.00 |
| 57-bus | 57 | 41,760 | 41,582.0 | 0.165 | 4 | 0.140 | 3 | 99.57 | 84.85 |
| 118-bus | 118 | 129,890.7 | 126,521.0 | 0.92 | 6 | 0.391 | 4 | 97.41 | 42.50 |
| 300-bus | 300 | 719,753.6 | 690,226.0 | 1.17 | 4 | 0.890 | 3 | 95.90 | 76.07 |
| 582-bus | 582 | 334,044.4 | 326,596.0 | 3.187 | 6 | 2.615 | 4 | 97.77 | 82.05 |

As further shown, the method 600 provides a greater minimization of the power generation cost as compared to the bus-wise optimal power flow (BWOPF) formulation, especially for power systems having a larger quantity of busses. By way of example, the cost generation solution using the BWOPF method for a 582-bus system is approximately $334,000, while the generation cost solution using the LWOPF method 600 is approximately $326,000. Accordingly, the LWOPF method provides a greater minimization of the power cost, and accordingly, avoids potential economic loss. It will be appreciated that, in real power systems, which include thousands of buses, the cost savings are greatly increased using the LWOPF method.

Table 8 also demonstrates that the LWOPF method is able to achieve a better minimization of the cost function in less execution time, and in some cases, in less iterations of the method 600. For example, in a 582-bus power system, the LWOPF method is able to generate a high quality solution to the objective function in 4 iterations and 2.615 seconds, as opposed to 6 iterations and 3.817 seconds for the BWOPF method.

Table 9, below, demonstrates the SLP based LWOPF method using different static load models. The load models includes constant power (PC), constant current (CC), constant impedance (CI), and a ZIP model.

TABLE 9

Performance of SLP based LWOPF with various load models

| System | Load model | Objective: Generation Cost ($) | Execution time (seconds) | Iter # |
|---|---|---|---|---|
| 6-bus | Constant Power (CP) | 3,094.7 | 0.028 | 2 |
|  | Constant Current (CC) | 3,094.7 | 0.028 | 2 |
|  | Constant Impedance (CI) | 3,094.5 | 0.029 | 2 |
|  | ZIP Model (40% CP, 30% CC and 30% CI) | 3,095.2 | 0.032 | 2 |
| 57-bus | Constant Power (CP) | 4,1582.0 | 0.140 | 3 |
|  | Constant Current (CC) | 4,1598.0 | 0.144 | 3 |
|  | Constant Impedance (CI) | 4,1622.0 | 0.149 | 3 |
|  | ZIP Model (40% CP, 30% CC and 30% CI) | 4,1654.0 | 0.152 | 3 |
| 118-bus | Constant Power (CP) | 126,521.0 | 0.391 | 4 |
|  | Constant Current (CC) | 126,578.0 | 0.416 | 4 |
|  | Constant Impedance (CI) | 126,674.0 | 0.428 | 4 |
|  | ZIP Model (40% CP, 30% CC and 30% CI) | 126,988.0 | 0.460 | 4 |

As shown, the performance of the SLP based LWOPF is consistent and reliable and is not otherwise susceptible to change based on the load model. In particular, for each bus system, the objective solution to the cost function does not substantially change as between different system models. Further, the execution time and the number of iterations required to minimize the objective function also does not change based on the static load model.

Referring now to FIG. 8, there shown a table 800 comparing an SLP formulation for solving the OPF based on a line-wise set of power balance (LWBP) equations versus using a set of bus-wise power balance (BWPB) equations.

In particular, FIG. 8 shows that LWBP equations includes fewer higher order terms as compared to the BWBP, and includes fewer sinusoidal terms in the "A" and "C" matrices, where the "A" matrix is the constraint coefficient matrix and the "C" matrix is the objective function coefficient vector. Accordingly, as stated previously, this reduces computation burden, and allows the LWOPF to execute faster than the bus-wise method. FIG. 8 also shows that the LWBP have better conditioned Jacobian matrices.

While the applicant's teachings described herein are in conjunction with various embodiments for illustrative purposes, it is not intended that the applicant's teachings be limited to such embodiments as the embodiments described herein are intended to be examples. On the contrary, the applicant's teachings described and illustrated herein encompass various alternatives, modifications, and equivalents, without departing from the embodiments described herein, the general scope of which is defined in the appended claims.

The invention claimed is:

1. A method for conducting a power flow analysis for a power system, the power system comprising at least one transmission branch having a first end coupled to a first bus and a second end coupled to a second bus, the method being implemented by at least one server comprising at least one processor, the method comprising:
   initializing values for a problem vector (W), wherein the problem vector (W) is defined as W=[U δ PF PS QF QS], where:
      U is a vector of squared voltage magnitudes for each bus of each of the at least one transmission branch;
      δ is a vector of voltage angles for each bus of each of the at least one transmission branch;
      PF is a vector of active power flow in each first end of each of the at least one transmission branch;
      PS is a vector of active power flow in each second end of each of the at least one transmission branch;
      QF is a vector of reactive power flow in each first end of each of the at least one transmission branch, and
      QS is a vector of reactive power flowing in each second end of each of the at least one transmission branch;
   modelling the power system using a set of line-wise power balance equations that are functions of the problem vector (FT(W)), wherein the set of line-wise power balance equations (FT(W)) is defined as:

$$FT(W) = \begin{bmatrix} FF(W) \\ FS(W) \\ FA(W) \\ FB(W) \\ FP(W) \\ FQ(W) \end{bmatrix}$$

where:
   FF(W) is a vector of line based voltage functions in relation to each first end of each of the at least one transmission branch;
   FS(W) is a vector of line-based voltage function in relation to each second end of each of the at least one transmission branch;
   FA(W) is a vector of phase angle functions in relation to each first end of each of the at least one transmission branch;
   FB(W) is a vector of phase angle functions in relation to each second end of each of the at least one transmission branch;
   FP(W) is a vector of functions for bus-wise real power injections;
   FQ(W) is a vector of functions for bus-wise reactive power injections, and
   wherein the set of line-wise based equations is formulated in terms of the square magnitude of the voltages at each bus in each of the at least one transmission branch in the power system;
solving the set of line-wise power balance equations (FT(W)) using a numerical technique to obtain a line-wise solution vector;
based on the line-wise solution vector, determining whether the power system is in a state of voltage stability; and
implementing a remedial action to stabilize the power system when the power system is not in a state of voltage stability.

2. The method of claim 1, wherein the numerical technique for solving the set of line-wise power balance equations is a Newton-Raphson technique comprising:
determining an incremental change to the problem vector ($\Delta W$) by solving a first-order Taylor's series approximation of the set of line-wise power balance equations (FT(W)):

$$\Delta W = \left[\frac{\partial FT(W)}{\partial W}\right]^{-1} \cdot [ST - FT(W)]$$

where:
$\Delta W$ is the incremental change to the problem vector;

$$\left[\frac{\partial FT(W)}{\partial W}\right]^{-1}$$

is an inverse of a Jacobian matrix for the set of line-wise power balance equations; and
ST is the desired line-wise solution vector for the set of line-wise power balance equations.

3. The method of claim 2, wherein the desired line-wise solution vector (ST) is defined according to ST=[0 0 0 0 [PD−PG] [QD−QG]]$^T$,
where:
PD is a vector of active power demand in each of the at least one transmission branches;
PG is a vector of active power generation in each of the at least one transmission branches;
QD is a vector of reactive power demand in each of the at least one transmission branches, and
QG is a vector of reactive power generation in each of the at least one transmission branches.

4. The method of claim 3, further comprising:
generating an updated problem vector (W') according to the equation: W'=W+$\Delta W$;
solving the set of line-wise power balance equations to generate an intermediate solution vector using the updated problem vector (W'); and
based on the intermediate solution vector, determining whether a tolerance condition is satisfied,
wherein when the tolerance condition is not satisfied, the method comprises iteratively solving for the updated problem vector using the first-order Taylor's series approximation until the intermediate solution vector satisfies the tolerance condition, and
wherein when the tolerance condition is satisfied, the intermediate solution vector comprises the line-wise solution vector.

5. The method of claim 4, wherein the Jacobian matrix includes, for each of the at least one transmission branches, a first vector element $$\left(\frac{\partial FF(W)}{\partial U}\right)$$

and a second vector element $$\left(\frac{\partial FS(W)}{\partial U}\right),$$

where the first vector element defines a first voltage collapse index (VCI) for a first end of the at least one transmission branch, and the second vector element defines a second VCI for a second end of the at least one transmission branch.

6. The method of claim 5, wherein determining whether the power system is in a state of voltage stability comprises determining whether at least one of the first VCI and the second VCI for a respective transmission branch is substantially zero, and the remedial action to stabilize the power system comprises at least one of: shedding a load bus in the power system, increasing a power output at least one generator bus in the power system, activating at least one new generator bus in the power system, and re-inserting standby transmission elements in the power system.

7. The method of claim 6, wherein determining whether the power system is in a state of voltage stability further comprising: performing an N−1 contingency analysis for the power system.

8. A system for conducting a power flow analysis for a power system, wherein the power system comprises at least one transmission branch having a first end coupled to a first bus and a second end coupled to a second bus, the system comprising:
at least one server comprising at least one processor, wherein the at least one server is configured to perform the method of claim 1.

9. The system of claim 8, wherein the numerical technique for solving the set of line-wise power balance equations is a Newton-Raphson technique comprising:
determining an incremental change to the problem vector ($\Delta W$) by solving a first-order Taylor's series approximation of the set of line-wise power balance equations (FT(W)):

$$\Delta W = \left[\frac{\partial FT(W)}{\partial W}\right]^{-1} \cdot [ST - FT(W)]$$

where:
$\Delta W$ is the incremental change to the problem vector;

$$\left[\frac{\partial FT(W)}{\partial W}\right]^{-1}$$

is an inverse of a Jacobian matrix for the set of line-wise power balance equations; and
ST is a desired line-wise solution vector for the set of line-wise power balance equations.

10. The system of claim 9, wherein the Jacobian matrix includes, for each of the at least one transmission branches, a first vector element $$\left(\frac{\partial FF(W)}{\partial U}\right)$$

and a second vector element $$\left(\frac{\partial FS(W)}{\partial U}\right),$$

where the first vector element defines a first voltage collapse index (VCI) for a first end of the at least one transmission branch, and the second vector element defines a second VCI for a second end of the at least one transmission branch.

11. The system of claim 10, wherein determining whether the power system is in a state of voltage stability comprises determining whether at least one of the first VCI and the second VCI for a respective transmission branch is substantially zero, and the remedial action to stabilize the power system comprises at least one of: shedding a load bus in the power system, increasing a power output at least one generator bus in the power system, activating at least one new generator bus in the power system, and re-inserting standby transmission elements in the power system.

12. A method for minimizing an objective function in respect of a power system, the power system comprising at least one transmission branch having a first end coupled to a first bus and a second end coupled to a second bus, the method being implemented using at least one server comprising at least one processor, the method comprising:
   (a) determining initial values for a control vector (WC);
   (b) using the control vector (WC), solving a set of line-wise power balance equations (FT(W')) to obtain a problem vector (W'), wherein the problem vector (W') comprises the control vector (WC) and a dependent vector (WD) and the set of line-wise power balance equations (FT(W)) is defined as:

$$FT(W) = \begin{bmatrix} FF(W) \\ FS(W) \\ FA(W) \\ FB(W) \\ FP(W) \\ FQ(W) \end{bmatrix}$$

wherein:
FF(W) is a vector of line based voltage functions in relation to each first end of each of the at least one transmission branch;
FS(W) is a vector of line-based voltage function in relation to each second end of each of the at least one transmission branch;
FA(W) is a vector of phase angle functions in relation to each first end of each of the at least one transmission branch;
FB(W) is a vector of phase angle functions in relation to each second end of each of the at least one transmission branch;
FP(W) is a vector of functions for bus-wise real power injections, and
FQ(W) is a vector of functions for bus-wise reactive power injections;
   (c) using the problem vector (W'), solving a line-wise linear optimization formulation to determine an optimal incremental change to the control vector (ΔWC), wherein the problem vector (W') is defined as W'=[U, δ, PF, PS, QF, QS, PG, QG]$^T$, and the dependent vector (WD) is defined as WD=[U, δ, PF, PS, QF, QS]$^T$, and the control vector (WC) is defined as WC=[U, PG]$^T$, wherein:
U is a vector of squared voltages magnitudes for each bus of each of the at least one transmission branch;
δ is a vector of voltage angles for each bus of each of the at least one transmission branch;
PF is a vector of active power flow in each first end of each of the at least one transmission branch;

PS is a vector of reactive power flow in each second end of each of the at least one transmission branch;
QF is a vector of reactive power flow in each first end of each of the at least one transmission branch;
QS is a vector of reactive power flowing in each second end of each of the at least one transmission branch;
PG is a vector of active power generation in each of the at least one transmission branches, and
QG is a vector of reactive power generation in each of the at least one transmission branches;
   (d) updating the control vector (WC) based on the optimal incremental change in the control vector (ΔWC); and
   (e) determining whether the objective function is minimized by determining whether a set of stopping criteria is satisfied based on the updating of the control vector (WC), and
wherein when the set of stopping criteria is not satisfied, the method comprises iteratively repeating (b) to (d) until the set of stopping criteria is satisfied.

13. The method of claim 12, wherein the set of line-wise power balance equations (FT(W')) to obtain the problem vector (W') is solved by:
generating an updated problem vector (W') according to the equation: W'=W+ΔW;
solving the set of line-wise power balance equations to generate an intermediate solution vector using the updated problem vector (W'); and
based on the intermediate solution vector, determining whether a tolerance condition is satisfied,
wherein when the tolerance condition is not satisfied, the method comprises iteratively solving for the updated problem vector using the first-order Taylor's series approximation until the intermediate solution vector satisfies the tolerance condition, and
wherein when the tolerance condition is satisfied, the intermediate solution vector comprises the line-wise solution vector.

14. The method of claim 13, wherein the desired line-wise solution vector is defined as ST=[0 0 0 0 [PD] [QD]]$^T$, wherein:
PD is a vector of active power demand in each of the at least one transmission branch, and
PG is a vector of active power generation in each of the at least one transmission branch.

15. The method of claim 14, wherein the objective function $f_o(W')$ is a second-order power generation cost function expressed as:

$$f_o(W') = \sum_{g=1}^{NG} c1_g + c2_g \cdot PG_g + c3_g \cdot PG_g^2$$

wherein NG is a total number of power generators in the power system, $PG_g$ is the active power generation of a g-th power generator, $c1_g$ is a first constant for the g-th power generator, $c2_g$ is a second constant for the g-th power generator, and $c3_g$ is a third constant for the g-th power generator.

16. The method of claim 15, wherein the line-wise linear optimization formulation comprises a linearized objective function, a linearized set of equality constraints, and a linearized set of inequality constraints, wherein the linearized set of equality constraints is defined as:

$$[J\ D]\Delta W' = \Delta ST$$

wherein J is a first jacobian matrix, D is a second Jacobean matrix, and $\Delta ST$ is an incremental change to the line-wise solution vector, wherein $\Delta ST=[0\ 0\ 0\ 0\ 0\ 0]^T$, and and wherein the line-wise linear optimization formula is solved using a linear programming method.

17. The method of claim 16, wherein determining whether a set of stopping criteria is satisfied comprises determining whether a stopping condition is satisfied, wherein the stopping conditioned is defined as:

$$\frac{|f_o(W'^k) - f_o(W'^{k-1})|}{|f_o(W'^k)|} \le \gamma$$

where:
- $\gamma$ is a pre-determining mismatch tolerance;
- $f_o(W'^k)$ is a first output of the objective function using values in the problem vector (W') determined in a current iteration (k) of performing steps (a) to (d); and
- $f_o(W'^{k-1})$ is a second output of the objective function using values in the problem vector (W') determined in a previous iteration (k−1) of performing steps (a) to (d).

18. The method of claim 17, wherein a set of stopping criteria is satisfied when a set of equality and inequality constraints is satisfied, the set of equality constraints being defined by FT(W')=ST.

19. The method of claim 18, further comprising: based on the control vector (WC), determining whether the power system is in a state of voltage stability by performing an N−1 contingency analysis, and when the power system is not in a stage of voltage stability implementing a remedial action to stabilize the power system wherein the remedial action comprises at least one of: shedding a load bus of the power system, increasing a power output at least one generator bus in the power system, activating at least one new generator bus in the power system, and re-inserting standby transmission elements in the power system.

20. A system for minimizing an objective function in respect of a power system, the power system comprising at least one transmission branch having a first end coupled to a first bus and a second end coupled to a second bus, the system comprising:
at least one server comprising at least one processor that is configured to perform the method of claim 12.

21. The system of claim 20, wherein solving the set of line-wise power balance equations (FT(W')) to obtain the problem vector (W'), comprises:

generating an updated problem vector (W') according to the equation: W'=W+ΔW;
solving the set of line-wise power balance equations to generate an intermediate solution vector using the updated problem vector (W'); and
based on the intermediate solution vector, determining whether a tolerance condition is satisfied,
wherein when the tolerance condition is not satisfied, the method comprises iteratively solving for the updated problem vector using the first-order Taylor's series approximation until the intermediate solution vector satisfies the tolerance condition, and
wherein when the tolerance condition is satisfied, the intermediate solution vector comprises the line-wise solution vector.

22. The system of claim 21, wherein the desired line-wise solution vector is defined as $ST=[0\ 0\ 0\ 0\ [PD]\ [QD]]^T$, wherein:
PD is a vector of active power demand in each of the at least one transmission branch, and
PG is a vector of active power generation in each of the at least one transmission branch.

23. The system of claim 22, wherein the objective function $f_o(W')$ is a second-order power generation cost function expressed as:

$$f_o(W') = \sum_{g=1}^{NG} c1_g + c2_g \cdot PG_g + c3_g \cdot PG_g^2$$

wherein NG is a total number of power generators in the power system, $PG_g$ is the active power generation of a g-th power generator, $c1_g$ is a first constant for the g-th power generator, $c2_g$ is a second constant for the g-th power generator, and $c3_g$ is a third constant for the g-th power generator.

24. The system of claim 23, wherein the line-wise linear optimization formulation comprises a linearized objective function, a linearized set of equality constraints, and a linearized set of inequality constraints, wherein the linearized set of equality constraints is defined as:

$[J\ D]\Delta W'=\Delta ST$ wherein J is a first jacobian matrix, D is a second Jacobean matrix, and $\Delta ST$ is an incremental change to the line-wise solution vector, wherein $\Delta ST=[0\ 0\ 0\ 0\ 0\ 0]^T$, and and wherein the line-wise linear optimization formula is solved using a linear programming method.

* * * * *